United States Patent
Matsumoto et al.

(10) Patent No.: US 8,307,022 B2
(45) Date of Patent: Nov. 6, 2012

(54) RANDOM NUMBER GENERATING DEVICE

(75) Inventors: Mari Matsumoto, Yokohama (JP);
Ryuji Ohba, Kawasaki (JP); Shinichi Yasuda, Kawasaki (JP); Shinobu Fujita, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1195 days.

(21) Appl. No.: 12/130,567

(22) Filed: May 30, 2008

(65) Prior Publication Data
US 2009/0327379 A1 Dec. 31, 2009

(30) Foreign Application Priority Data
May 31, 2007 (JP) ................................. 2007-145095

(51) Int. Cl.
*G06F 1/02* (2006.01)
(52) U.S. Cl. ...................................................... 708/255
(58) Field of Classification Search .................... 708/255
See application file for complete search history.

(56) References Cited

U.S. PATENT DOCUMENTS

| | | | |
|---|---|---|---|
| 7,392,271 B2 | 6/2008 | Yasuda et al. | |
| 2002/0080965 A1* | 6/2002 | Marinet et al. | 380/268 |
| 2005/0180219 A1 | 8/2005 | Ohba et al. | |
| 2007/0296025 A1 | 12/2007 | Matsumoto et al. | |

FOREIGN PATENT DOCUMENTS

| | | |
|---|---|---|
| EP | 1 855 191 A2 | 11/2007 |
| JP | 2003-108363 | 4/2003 |
| JP | 2005-18500 | 1/2005 |
| JP | 2006-189946 | 7/2006 |
| JP | 2007-103829 | 4/2007 |

OTHER PUBLICATIONS

Mari Matsumoto, et al., "Random Number Generator with 0.3MHz Generation Rate Using Non-Stoichiometric $Si_xN$ MOSFET", Extended Abstracts of the 2006 International Conference on Solid State Devices and Materials, 2006, pp. 280-281.
U.S. Appl. No. 12/050,079.
U.S. Appl. No. 12/504,998, filed Jul. 17, 2009, Matsumoto, et al.

* cited by examiner

*Primary Examiner* — Tan V. Mai
(74) *Attorney, Agent, or Firm* — Oblon, Spivak, McClelland, Maier & Neustadt, L.L.P.

(57) ABSTRACT

A random number generating device includes: a pulse voltage generator configured to generate a pulse voltage having an amplitude of 26 mV or more; a random noise generating element including source and drain regions formed at a distance from each other on a semiconductor substrate, a tunnel insulating film formed on a portion of the semiconductor substrate located between the source region and the drain region, and a gate electrode formed above the tunnel insulating film and to which the pulse voltage is applied, the random noise generating element configured to generate a random noise contained in a current flowing between the source region and the drain region; and a random number generating unit configured to generate a random number signal based on the random noise.

19 Claims, 23 Drawing Sheets

RANDOM NUMBER GENERATING DEVICE

CROSS-REFERENCE TO RELATED APPLICATION

This application is based upon and claims the benefit of priority from prior Japanese Patent Application No. 2007-145095 filed on May 31, 2007 in Japan, the entire contents of which are incorporated herein by reference.

BACKGROUND OF THE INVENTION

1. Field of the Invention

The present invention relates to a random number generating device.

2. Related Art

Random numbers are used to perform encryption and authentication to ensure information security. As more and more mobile devices are used recently, there has been an increasing demand for small-sized, high-speed random number generating devices. Conventionally, pseudorandom numbers have been used in small-sized terminal devices such as mobile devices.

However, to protect personal information, a more sophisticated security technique is now required. To avoid unauthorized decryption, more unpredictable true random numbers need to be generated. In generating true random numbers, random noise generated through a physical phenomenon can be effectively used. By a known technique for generating random noise based on a physical phenomenon, fluctuations of diode currents are utilized. By this method, however, a large amplifier circuit is required to amplify fine while noise. With a large amplifier circuit, it is difficult to form a small-sized random number generating device.

There have also been small-sized random number generating devices that have SiN MOSFETs as random noise generating elements (see M. Matsumoto, et al., "International Conference on Solid State Devices and Materials", SSDM (Solid State Device and Materials) 2006, p.p. 280-281, 2006, for example). In such a SiN MOSFET, only a very thin tunnel insulating film is interposed between the channel and traps based on dangling bonds in a nonstoichiometric SiN film. When a fixed voltage is applied to the gate electrode, random electron charging and discharging are caused between the channel and the trap due to heat fluctuations. Accordingly, by applying a fixed voltage to the gate electrode, the conductivity of the channel region is randomly varied with the amount of charges captured by the trap based on the dangling bonds existing in the nonstoichiometric SiN film. As a result, the current flowing through the channel randomly varies, to generate random noise. This random noise is converted into digital random numbers. In this manner, random numbers can be generated.

There have also been small-sized random number generating devices that have MOSFETs as random noise generating elements. Such a MOSFET has a set of conductive Si fine particles formed on the tunnel insulating film (see US 2005/0180219 A1, for example). When a fixed voltage is applied to the gate electrode of the MOSFET, random electron charging and discharging are caused between the channel and the set of conductive Si fine particles due to heat fluctuations. Random noise is then generated in the drain current flowing through the channel.

Normally, it is preferable that random numbers are generated at a high generating rate. However, the above described random noise generating elements disclosed by M. Matsumoto, et al., in "International Conference on Solid State Devices and Materials", SSDM (Solid State Device and Materials) 2006, p.p. 280-281, 2006, and in US 2005/0180219 A1 are need to generate high-quality random numbers at an expected high-speed generating rate.

As described above, to further improve information security, there is a demand for small-sized random number generating devices that can generate high-quality random numbers at higher speeds. However, it has been difficult to form a random number generating device that can generate high-quality random numbers at a high speed.

SUMMARY OF THE INVENTION

The object of the present invention is to provide a random number generating device that can generate high-quality random numbers at a high speed.

A random number generating device according to an aspect of the present invention includes: a pulse voltage generator configured to generate a pulse voltage having an amplitude of 26 mV or more; a random noise generating element including source and drain regions formed at a distance from each other on a semiconductor substrate, a tunnel insulating film formed on a portion of the semiconductor substrate located between the source region and the drain region, and a gate electrode formed above the tunnel insulating film and to which the pulse voltage is applied, the random noise generating element configured to generate a random noise contained in a current flowing between the source region and the drain region; and a random number generating unit configured to generate a random number signal based on the random noise.

DESCRIPTION OF THE EMBODIMENTS

First, a random noise generating element that is included in a random generating device of an embodiment of the present invention is explained before embodiments of the present invention are described.

Figure 2:
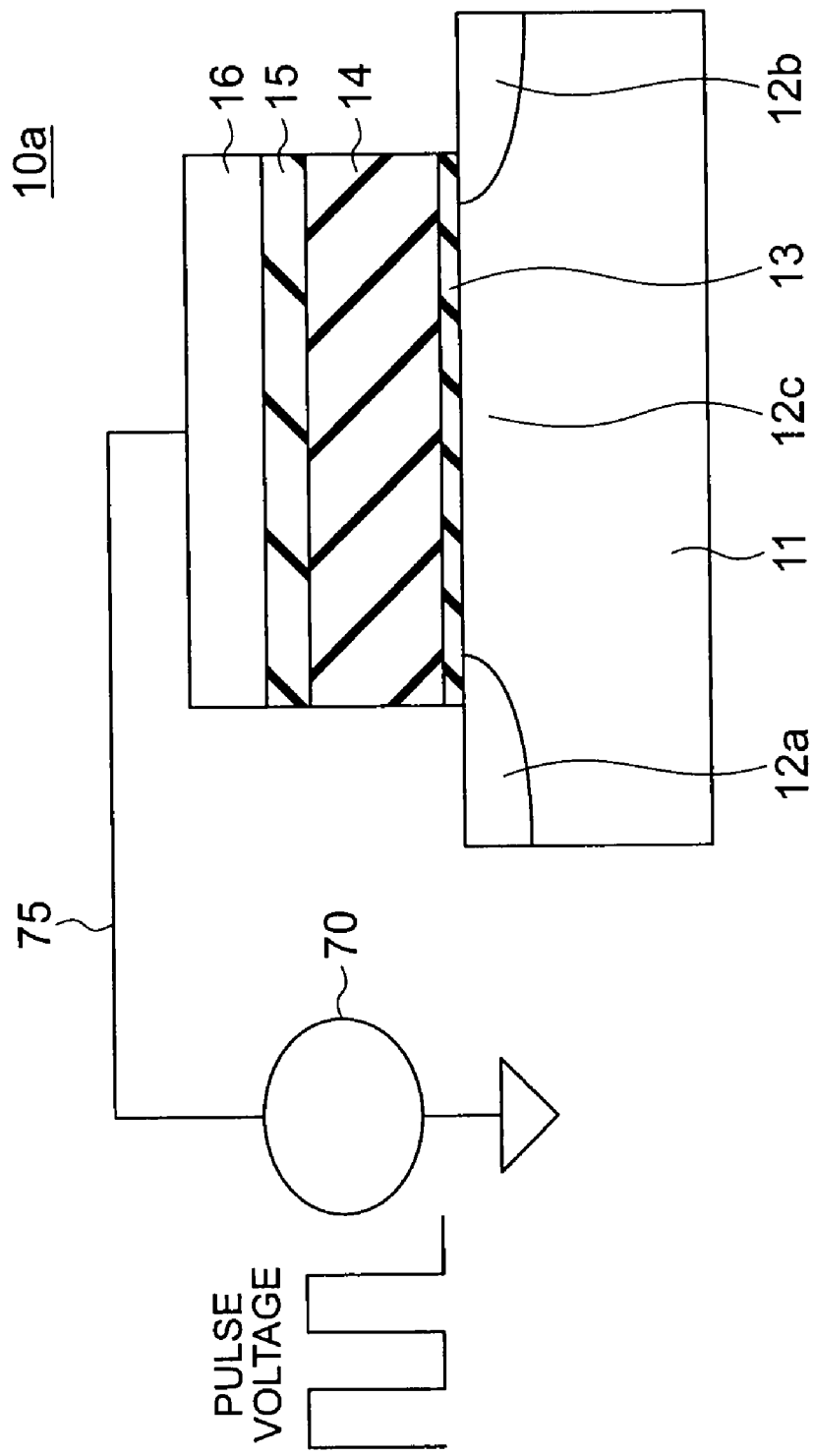
FIG. 2 is a cross-sectional view illustrating a random noise generating element according to first to third embodiments.

A random noise generating element $10a$ to be used in this embodiment is a SiN MOSFET that is a MOSFET having traps insulating film containing silicon nitride. FIG. 2 shows the structure of the random noise generating element $10a$. In the random noise generating element $10a$, a source region $12a$ and a drain region $12b$ are formed in the surface regions of a silicon substrate (a semiconductor substrate) 11. The region of the semiconductor substrate located between the source region $12a$ and the drain region $12b$ serves as a channel region $12c$. The gate length L and the channel width (the gate width) W of the channel region $12c$ should preferably be small. The channel region $12c$ may be a region having a thin portion as part of the channel, with the thin portion having the length L and the width W. The source region $12a$ and the drain region $12b$ contain n-type impurities such as phosphorus (P) and arsenic (As). The channel region $12c$, the source region $12a$, and the drain region $12b$ are isolated from one another by device isolating insulating regions (not shown).

A tunnel insulating film 13 is formed on the channel region $12c$, and a trap insulating film 14 is formed on the tunnel insulating film 13. The tunnel insulating film 13 and the trap insulating film 14 constitute an insulator unit. The trap insulating film 14 has traps formed with dangling bonds, and is made of a material represented by the general expression: $Si_x(SiO_2)_y(Si_3N_4)_{1-y}M_z$ ($x \geq 0$, $1 \geq y \geq 0$, $z \geq 0$). Here, M represents an element other than Si, O, and N. Accordingly, the trap insulating film 14 is a nonstoichiometric silicon oxynitride film or silicon nitride film. A control oxide film (a control insulating film) 15 is formed on the trap insulating film 14, and a gate electrode (a control electrode) 16 made of $n^+$-polysilicon is formed on the control oxide film 15.

As described above, the random noise generating element $10a$ has the trap insulating film 14 having traps formed with dangling bonds. Accordingly, by applying a predetermined voltage to the gate electrode 16, electron charging or discharging can be caused between the channel region $12c$ and the trap insulating film 14 via the tunnel insulating film 13 in the random noise generating device $10a$. Since only the tunnel insulating film 13 having a very small thickness is interposed between the channel region $12c$ and the trap insulating film 14, random electron charging or discharging is caused due to heat fluctuations. Accordingly, the conductivity of the channel region $12c$ randomly varies with the amount of charge captured by the traps in the trap insulating film 14. In other words, the current flowing between the source region $12a$ and the drain region $12c$ randomly varies with the amount of charge captured by the traps. In this manner, by connecting a later described circuit to the random noise generating element, it becomes possible to generate random numbers based on the random variation of the conductivity of the channel region $12c$.

Further, in each of the embodiments of the present invention, a pulse voltage (a clock pulse, for example) 75 generated from a pulse voltage generator 70 is applied to the gate electrode 16 of the random noise generating element $10a$. With this arrangement, a change is caused in the electric field between the channel region $12c$ and the trap insulating film 14, and electron charging or discharging is facilitated. Accordingly, the random noise becomes larger than in a case where a fixed voltage is applied to the gate electrode 16 of the random noise generating element $10a$.

The fluctuation components generated in this random noise generating element should preferably contain 0.1% or more of 1-MHz fluctuation components. If the proportion of the 1-MHz fluctuation components is 0.1% or more, the conditions for generating true random numbers at a random number generating rate of 1 Mbits/sec or higher can be satisfied without an amplifier circuit. In such a case, high versatility for information security can be achieved.

Even in a case where the random noise generating element is formed with an element that does not achieve 0.1% or more of 1-MHz fluctuation components when a fixed voltage is applied, the random noise should reach the above described value when a pulse voltage is applied. The fluctuation components can be further increased by employing a high-performance random noise generating element that achieves 0.1% or more of 1-MHz fluctuation components when a fixed voltage is applied.

The requirement that the 0.1% or more of 1-MHz fluctuation components should be generated in the random noise generating element is determined by experiment data and the likes. More specifically, an example case where random numbers are generated with the use of a circuit that includes a multivibrator circuit containing a random noise generating element, a counter, and the likes is now described (see "International Conference on Solid State Devices and Materials, S. Yasuda et al., p.p. 250-251, 2002). The multivibrator circuit is an oscillator circuit. As one of the resistors forming the circuit is replaced with a random noise generating element, a fluctuation is caused in the oscillation cycle. The oscillation cycle is proportional to the product of the resistance and the electric capacity. The counter includes a clock enable terminal and a CK terminal. Random oscillation signals that are output from the multivibrator are input to the clock enable terminal of the counter, and a clock generated from a ring oscillator or the like is input to the CK terminal. Here, the random oscillation signals are counted to determine whether the count value is an odd number or an even number. In accordance with the count number, "1" or "0" is output. If the fluctuation width of the oscillation cycle is measured with a 1-GHz clock that is normally the fastest obtained from a ring oscillator, the fluctuation of the oscillation cycle should be larger than at least 1 ns (the inverse of 1 GHz, or 0.1% of 1 μs) to output "1" or "0".

Therefore, the fluctuation components at the frequency of 1 MHz need to be 0.1% of 1 MHz or larger.

The reason that 1 MHz is used as the reference value to evaluate the size of random noise is that a random number generating rate should be normally 1 MHz or higher to generate random numbers with high versatility. Random numbers generated at a random number generating rate lower than 1 MHz are good enough to use, but a higher random number generating rate is preferred.

As already mentioned, in a random noise generating element of the present invention, electron charging and discharging are performed by traps existing in the trap insulating film 14. The electron charging and discharging are caused due to the change in the electric field caused by applying a pulse voltage to the gate electrode, as well as the influence of the heat fluctuation. Accordingly, the random noise components can be made larger than in a case where a fixed voltage is applied to the gate electrode as in conventional cases. The electrons charged by the traps can be more easily released due to a change caused in the electric field by pulse voltage application as well as a heat fluctuation, compared with a case where the gate voltage is constant. Also, when an electric field is induced in the opposite direction, electrons can be easily injected. Accordingly, the amount of electron charge and discharge can be increased, and the fluctuation components can be made larger. At this point, the amplitude of the pulse voltage to be applied to the gate electrode needs to be 26 mV or greater. This is because the amplitude of the pulse voltage needs to be larger than the heat fluctuation (the heat fluctuation ($k_B$ T) of electrons at room temperature (300 K) is 26 meV). By applying a voltage of 26 mV or higher, energy of 26 meV or larger is given to the charges.

Figure 3:
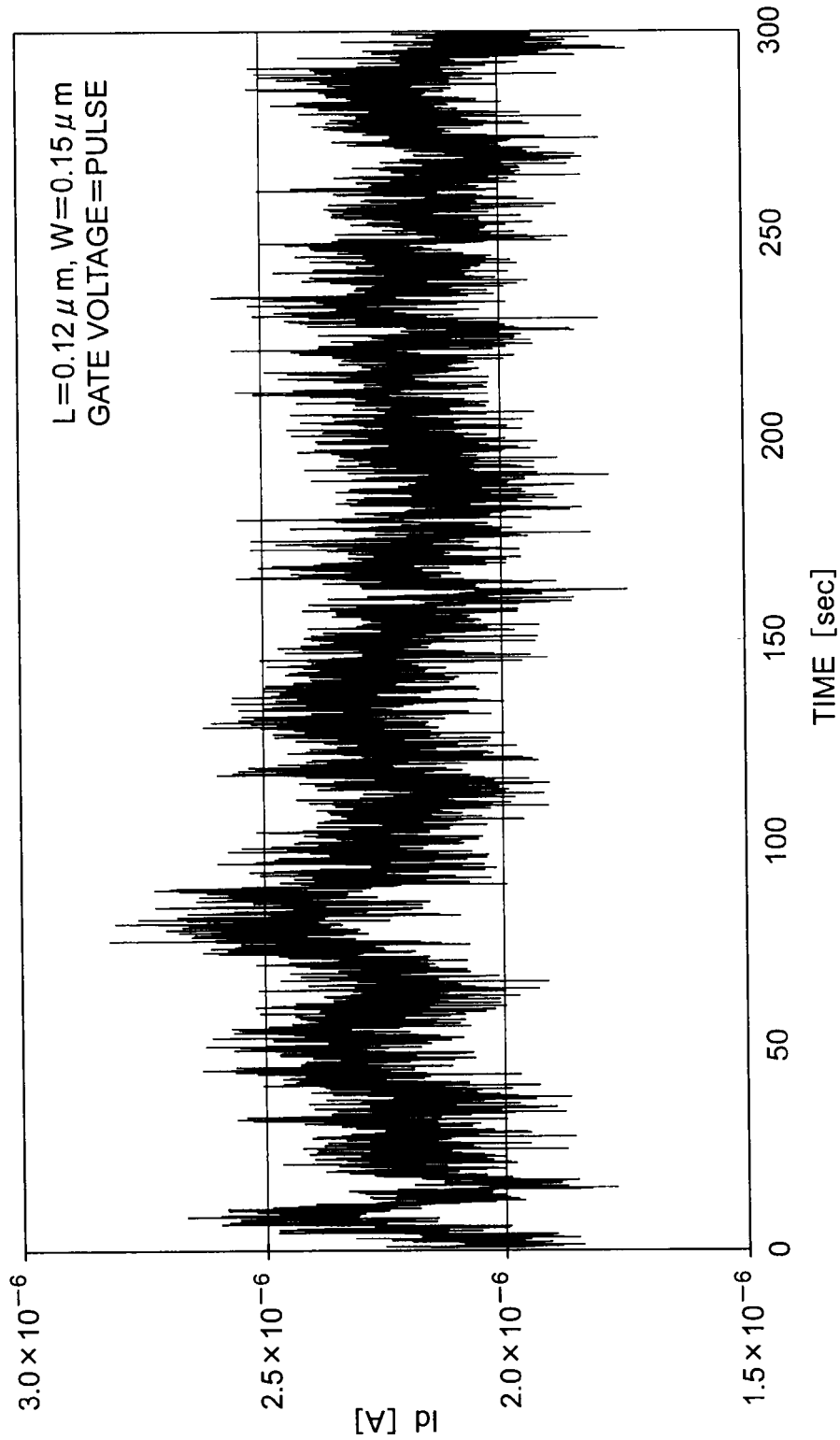
FIG. 3 is a waveform chart of a drain current that is observed when a pulse voltage is applied to the gate electrode of the random noise generating element shown in FIG. 2.
Figure 4:
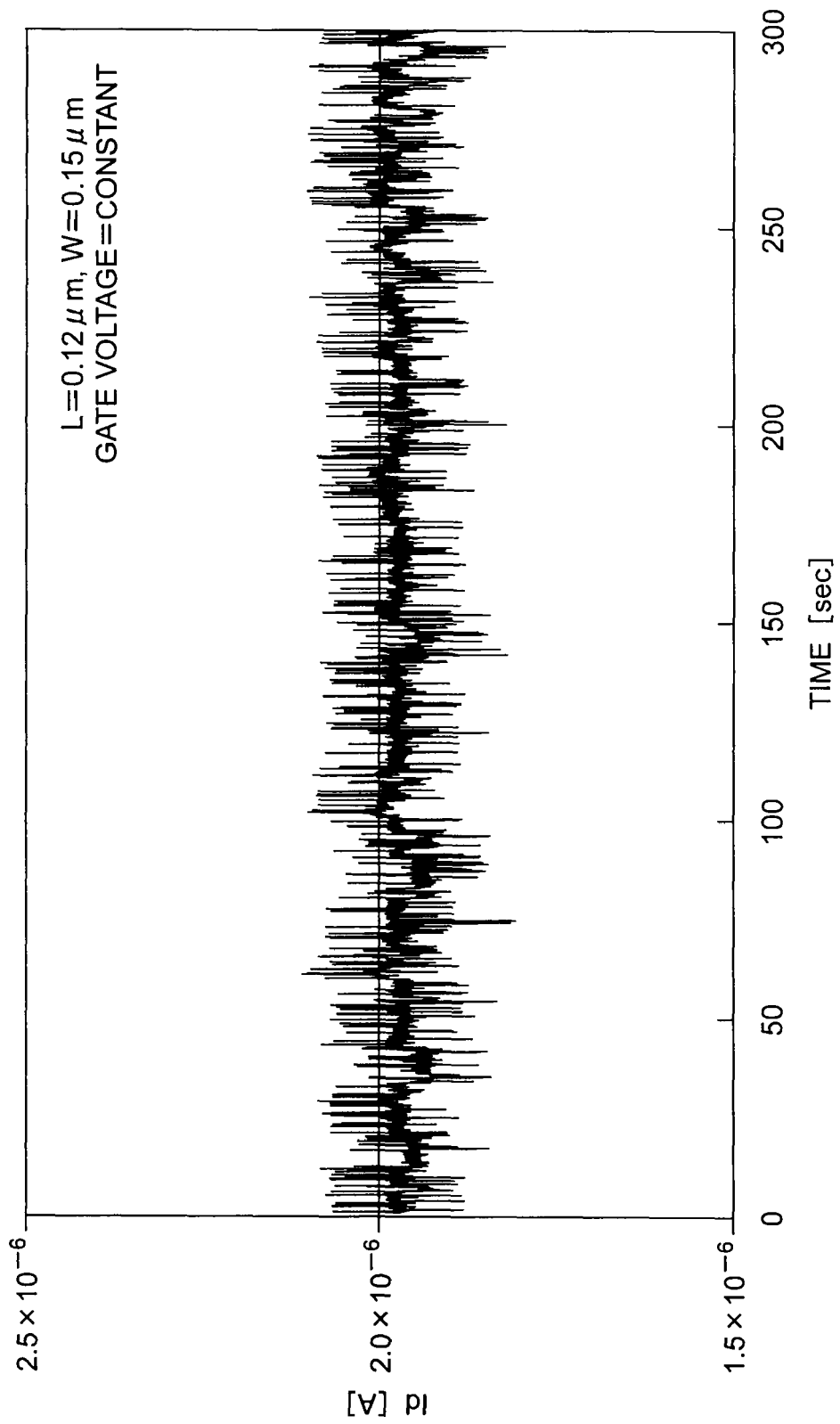
FIG. 4 is a waveform chart of a drain current that is observed when a fixed voltage is applied to the gate electrode of the random noise generating element shown in FIG. 2.
Figure 5:
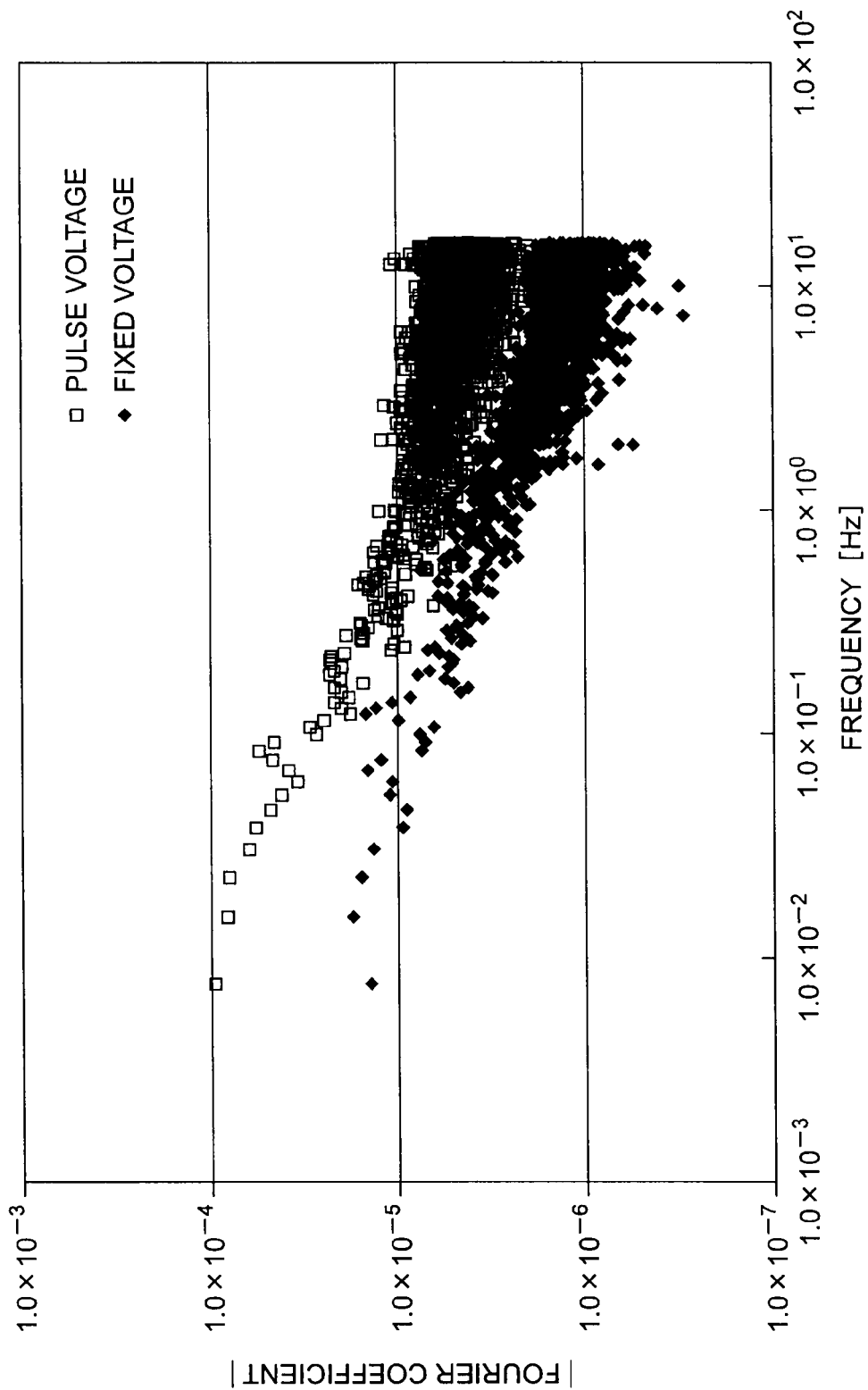
FIG. 5 shows the frequency characteristics of the drain current waveforms shown in FIGS. 3 and 4.

FIG. 3 shows the results of an experiment conducted to measure the drain current $I_d$ that was observed between the source and the drain when a pulse voltage was applied to the gate electrode 16 of the above described random noise generating element 10a. FIG. 4 shows the results of an experiment conducted to measure the drain current $I_d$ that was observed between the source and the drain when a fixed voltage was applied to the gate electrode 16. FIG. 5 shows the frequency characteristics with respect to the fluctuations of those drain currents.

The same random noise generating element 10a was used in those experiments. The gate length L was 0.12 μm, and the channel width W was 0.15 μm. In the random noise generating element 10a, the atom number ratio between Si and N in the trap insulating film 14 formed with a nonstoichiometric SiN film was 1:1. The tunnel insulating film 13 was a $SiO_2$ film, and has a film thickness T of 0.7 nm. In the random noise generating element 10a, the atom number ratio between Si and N in the SiN film 14 was almost the optimum ratio, and the material of the tunnel insulating film 13 was almost the optimum material. The cycle of the pulse voltage applied to the gate electrode 16 of the random noise generating element 10a was 32 ms. The data acquisition cycle was the same as the cycle of the applied pulse voltage. In the random noise generating element 10a, the film thickness T of the tunnel insulating film 13 was 0.7 nm, the film thickness $T_{SiN}$ of the trap insulating film 14 formed with a silicon nitride film was 5 nm, the film thickness $T_{top}$ of the control insulating film 15 was 6 nm, and the amplitude ΔV of the pulse voltage applied to the gate electrode 16 was 4 V. The amplitude ΔV (=4V) of the pulse voltage is equivalent to the change of the electric field, which was approximately 4 MV/cm. This amplitude is considered to be an optimum voltage value within such a range as not to cause degradation of the random noise generating element.

In each embodiment of the present invention, the electric field in the element should preferably have a size of 10 MV/cm or smaller, so as to avoid degradation of the element. Accordingly, the upper limit of the amplitude of the pulse voltage should be set with the above fact taken into consideration. For example, where the film thickness of each insulating film is represented by an equivalent oxide thickness (EOT; for example, the EOT of a substance A (EOT(A)) is expressed as: Tphys.×($\in(SiO_2)/\in(A)$) (here, Tphys. represents the physical film thickness, $\in(SiO_2)$ represents the dielectric constant of $SiO_2$, and $\in(A)$ represents the dielectric constant of the substance A), the value obtained by dividing the applied voltage (the amplitude of the pulse voltage) by the total film thickness determined from the equivalent oxide thicknesses of the tunnel insulating film 13, the trap insulating film 14, the control insulating film 15, and the gate electrode 16 represents the electric field induced in the random noise generating element 10a. Accordingly, the upper limit of the amplitude of the pulse voltage can be determined from the upper limit of the electric field and the film thickness of each film of the element.

Also, in each embodiment of the present invention, the cycle of the pulse voltage is in synchronization with the random number generating rate, and 1 Hz should be sufficient as the cycle of the pulse voltage, unless a very high generating rate is required. Meanwhile, the frequency of a clock that is generally considered to be the fastest is approximately 1 GHz. Accordingly, the upper limit of the frequency of the pulse voltage to be actually applied is 1 GHz.

In the experiments shown in FIGS. 3 and 4, the voltage to be applied to the gate electrode was adjusted so that the value of each drain current Id became approximately 2 μA. Since the random noise generating element 10a used in the experiments was an n-type MOSFET, the pulse voltage to be applied to the gate electrode was adjusted to be a positive voltage.

As shown in FIG. 3, the fluctuation components of the current in the random noise generating element 10a when a pulse voltage was applied were large, and to be more specific, were approximately 20% for average current. As shown in FIG. 4, the fluctuation components of the current in the random noise generating element 10a when a fixed voltage was applied were small, and to be more specific, were approximately 10% for average current. As can be seen from those facts, the fluctuation components of the current in the case where a pulse voltage was applied to the gate electrode of the random noise generating element were much larger than in the case where a fixed voltage was applied to the gate electrode. As shown in FIG. 5, the current fluctuation components in the case where a pulse voltage was applied were substantially larger at any frequency than in the case where a fixed voltage was applied.

Accordingly, true random numbers generated with the noise obtained by applying a pulse voltage to the gate electrode 16 have higher quality than true random numbers generated with the noise obtained by applying a fixed voltage to the gate electrode 16. The tunnel insulating film 13 of the random noise generating element 10a is very thin. For example, in a random noise generating element having 0.1% or more of 1-MHz fluctuation components, charges move between the channel 12c and the trap insulating film 14 in a shorter mean tunneling time than 1 μs. Accordingly, if the cycle of the pulse voltage to be applied is 1 μs or longer, larger noise components than in a case where a fixed voltage is applied can be obtained at any frequency, regardless of the cycle of the pulse voltage to be applied to the gate electrode 16. The synchronous noise increasing effect achieved by applying a pulse voltage to the gate electrode 16 of the random noise generating element 10a is an effect discovered for the first time by the inventors conducting the experiments. Although the pulse voltage used in those experiments was a rectangular wave, the same results can be obtained with another waveform such as a sine wave or a triangular wave. In the following, the embodiments of the present invention are described, with reference with the accompanying drawings.

First Embodiment

Figure 1:
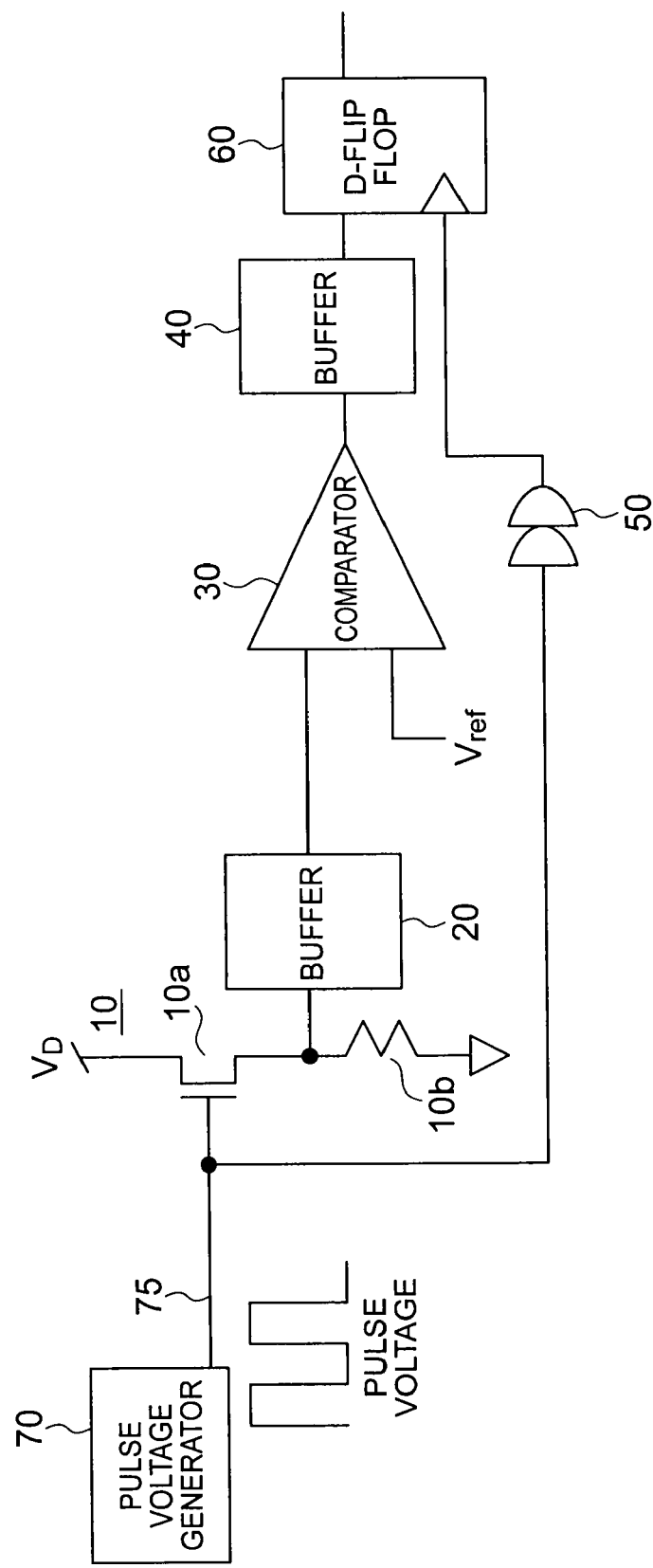
FIG. 1 is a block diagram of a random number generating device according to a first embodiment.

FIG. 1 shows a random number generating device in accordance with a first embodiment of the present invention. The random number generating device of this embodiment includes a random noise source 10 having a random noise generating element 10a and a load resistor 10b connected in series to each other, a buffer circuit 20, a comparator 30, a buffer circuit 40, a timing circuit 50, a latch circuit 60 formed with a D-flip-flop, and a pulse voltage generator 70.

Larger random noise can be obtained by applying a pulse voltage 75 generated from the pulse voltage generator 70 to the gate electrode 16 of the random noise generating element 10a. One end of the random noise generating element 10a is connected to a source voltage $V_D$, and the other end is connected to one end of the resistor 10b. An end of the resistor 10b is grounded.

In this embodiment, a random noise generating element that has 0.1% or more of 1-MHz fluctuation components obtained by applying a fixed voltage is used, and the fluctuation components are increased by applying a pulse voltage to the element. Also, a random noise generating element that has 1% or more, or 0.01% or more of 1-MHz fluctuation components is also described.

The random noise generating element 10a of the random number generating device of this embodiment is the SiN MOSFET shown in FIG. 2. In this random noise generating element 10a, a silicon oxide film is used as the tunnel insulating film 13. The trap insulating film 14 is a silicon oxynitride film formed with $Si_x(SiO_2)_y(Si_3N_4)_{1-y}M_z$ ($x \geq 0$, $1 \geq y \geq 0$, $z \geq 0$, except the case where $x=z=0$ and $y=1$) or a silicon nitride film. The trap insulating film 14 contains traps formed with dangling bonds. Here, M represents an element other than Si, O, and N.

Figure 6:
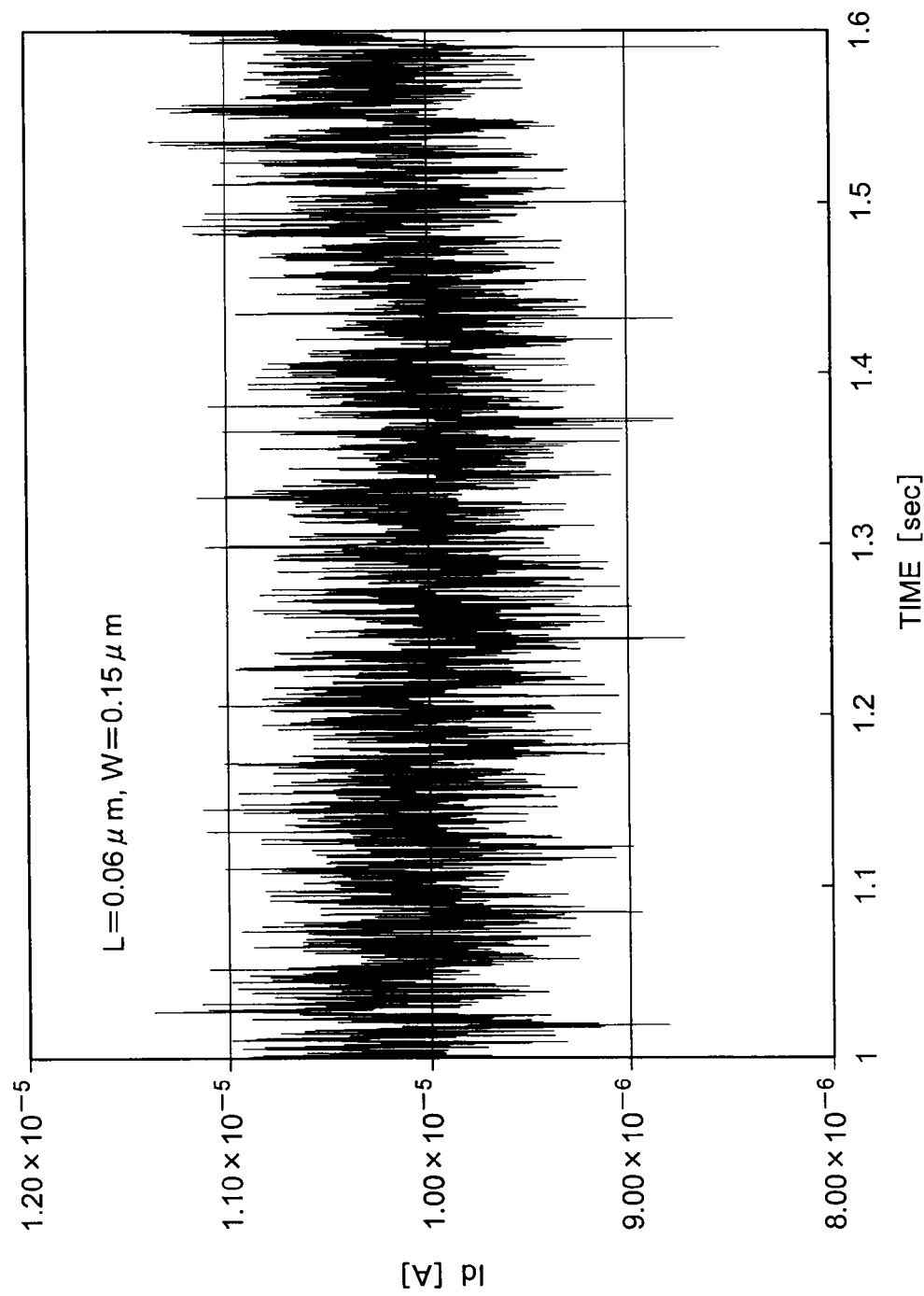
FIG. 6 is a waveform chart of a drain current that is observed when a fixed voltage is applied to the gate electrode of the random noise generating element shown in FIG. 2.

First, the fluctuation components obtained when a fixed voltage is applied to the gate electrode 16 of the random noise generating element 10a are described. FIG. 6 shows the fluctuation characteristics of the drain current $I_d$ observed when a fixed voltage is applied to the gate electrode 16 of the random noise generating element 10a. The random noise generating element 10a used here has a gate length L of 0.06 μm, and a gate width W of 0.15 μm. The film thickness T of the tunnel insulating film 13 is 0.7 nm, and the ratio Si/N between the Si atom number and the N atom number in the trap insulating film 14 is 1. As shown in FIG. 6, the drain current $I_d$ has a mean value of $1.00 \times 10^{-5}$ A. With the mean value being the center point, fluctuations are caused, and the half amplitude (the current fluctuation width) is 15% of the mean value at a maximum.

Figure 7:
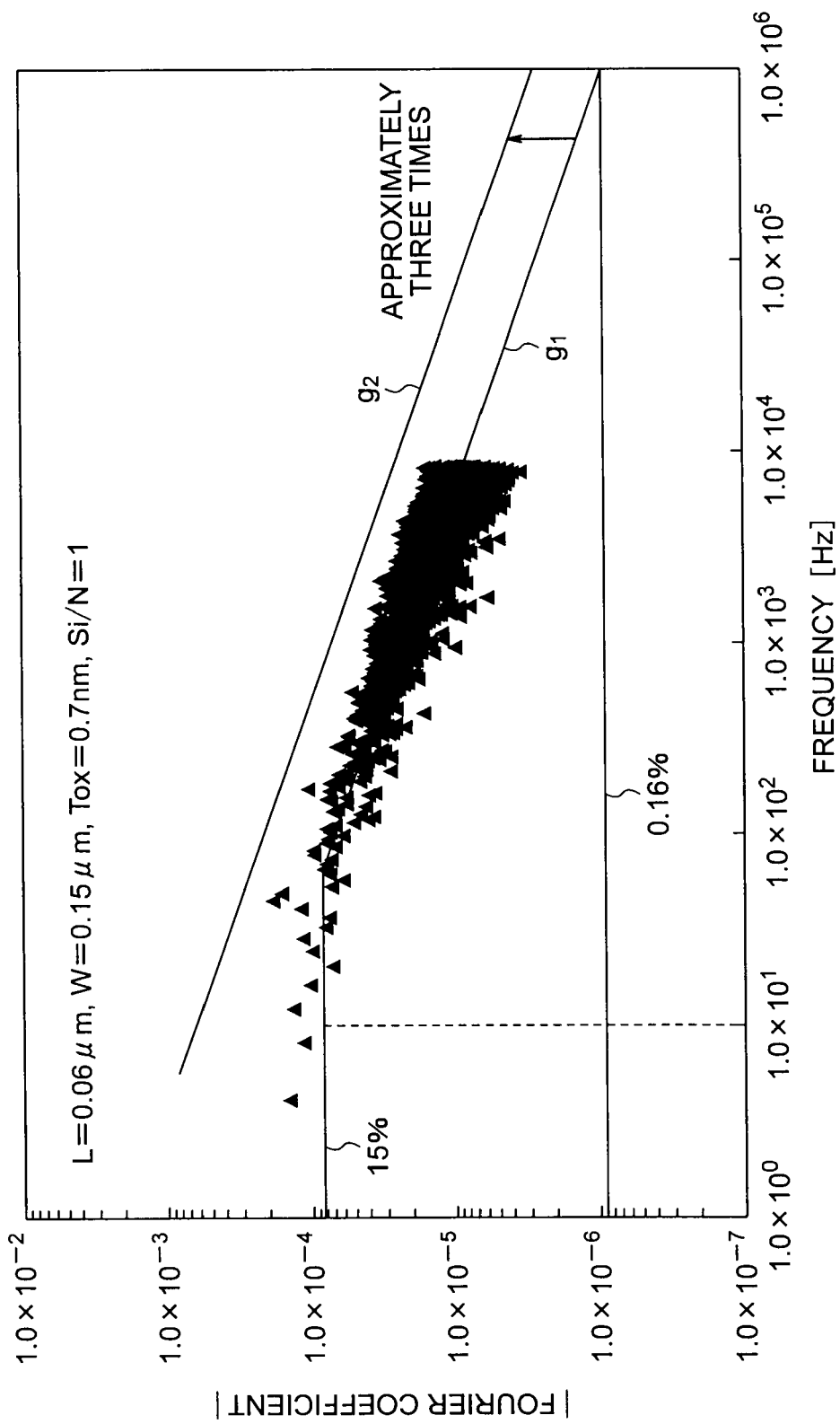
FIG. 7 shows the frequency characteristics of the current waveform shown in FIG. 6.

FIG. 7 shows the frequency characteristics obtained by sampling the drain current waveform shown in FIG. 6 every 60 μsec and carrying out Fourier transforms. In FIG. 7, the data obtained through Fourier transforms are indicated by black triangular dots. As can be seen from FIG. 7, the drain current fluctuations are formed with overlaps of frequency components. At higher frequencies, the amount of fluctuation components (the absolute value of the Fourier coefficient) becomes smaller. As already mentioned, the current fluctuation width of the current waveform shown in FIG. 6 is 15% of the mean value. If the main components of the 15% fluctuation are considered to be low-frequency components, and the 15% fluctuation components are equivalent to the 10-Hz components, the 10-Hz fluctuation components (the absolute value of the Fourier coefficient) is $8.4 \times 10^{-5}$. The frequency at which 0.1% of fluctuation components is observed, or the frequency at which the absolute value of the Fourier coefficient is $8.4 \times 10^{-8}$, is approximately 2.8 MHz according to the regression analysis equation that is set on the assumption that the frequency characteristics shown in FIG. 7 are represented by the straight line $g_1$ in the frequency region of 100 Hz and higher. The current fluctuation components at 1 MHz according to the straight line $g_1$ are approximately $9.0 \times 10^{-7}$, which is 0.16% of the mean value of the drain current $I_d$. Accordingly, the requirement that the random noise generated from the random noise generating element 10a contains 0.1% or more 1-MHz fluctuation components is satisfied.

Next, random noise generating elements 10a having different structure parameters were produced, and the dependence of the current fluctuation components of random noise on those structure parameters was examined. The structure parameters include the gate length L, the channel width W, the film thickness T of the tunnel insulating film 13, the ratio U between the Si atom number and the N atom number in the silicon nitride ($Si_UN$, $U>0.75$) serving as the trap insulating film 14.

Figure 8:
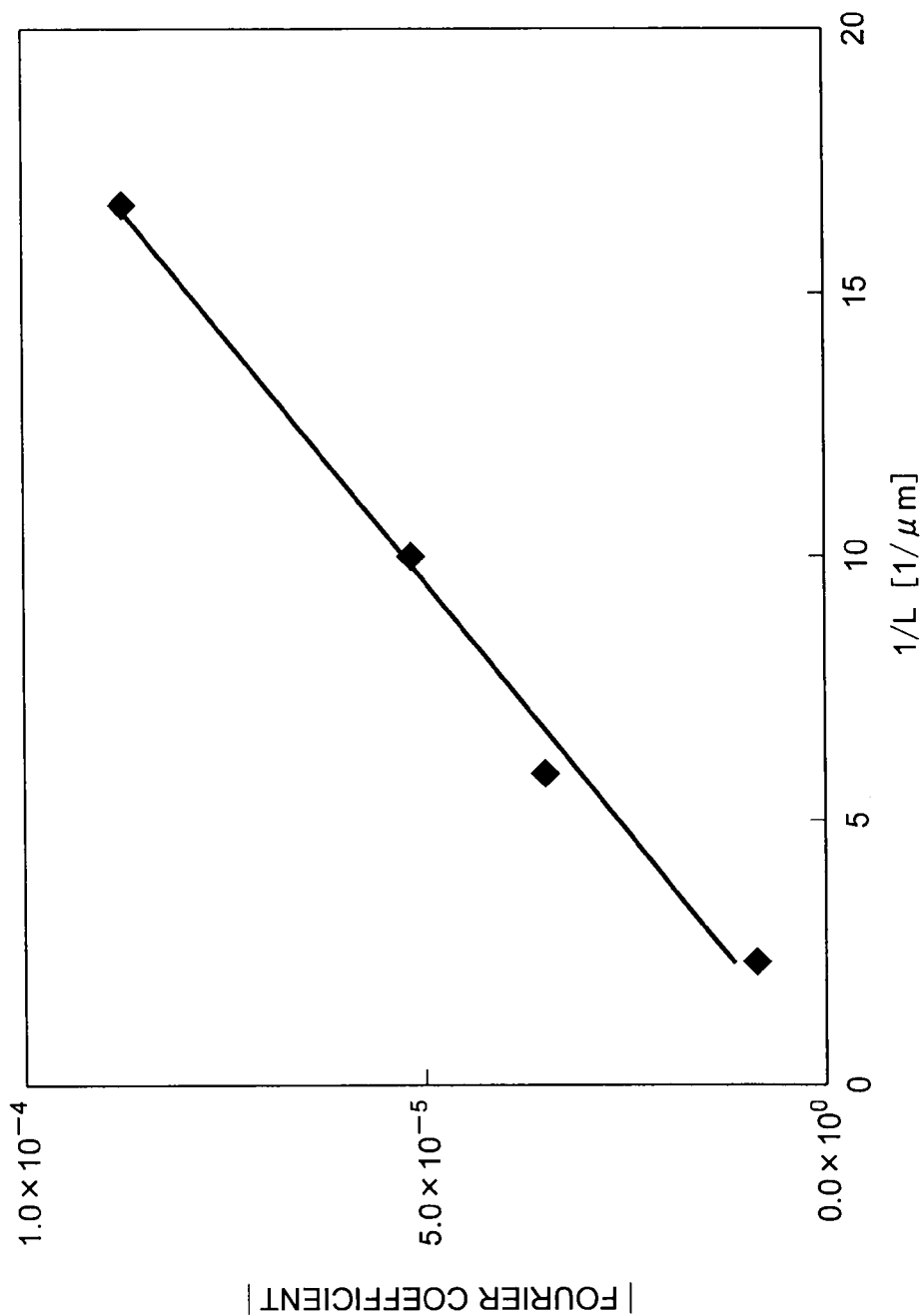
FIG. 8 shows the dependence of the current fluctuations on the channel length in a random noise generating element.

First, the dependence of the current fluctuation components of random noise on the gate length L, or the dependence of the absolute value of the Fourier coefficient on the gate length L at a predetermined frequency (100 Hz, for example), was examined, and the result is shown in FIG. 8. In FIG. 8, the abscissa axis indicates the inverse L of the gate length L, and the ordinate axis indicates the absolute value of the Fourier coefficient. In the random noise generating element 10a used in this experiment, the channel width (the gate width) W was 0.15 μm, the film thickness T of the tunnel insulating film 13 was 0.7 nm, and the atom number ratio Si/N between Si and N in the trap insulating film 14 was 1. As can be seen from FIG. 8, the current fluctuation components of random noise are proportional to the inverse 1/L of the gate length L. In this experiment, the Fourier coefficient was the value obtained at a frequency of 100 Hz. However, the inventors confirmed the fact that the characteristics of the current fluctuation components of random noise being proportional to 1/L did not depend on the frequency.

Figure 9:
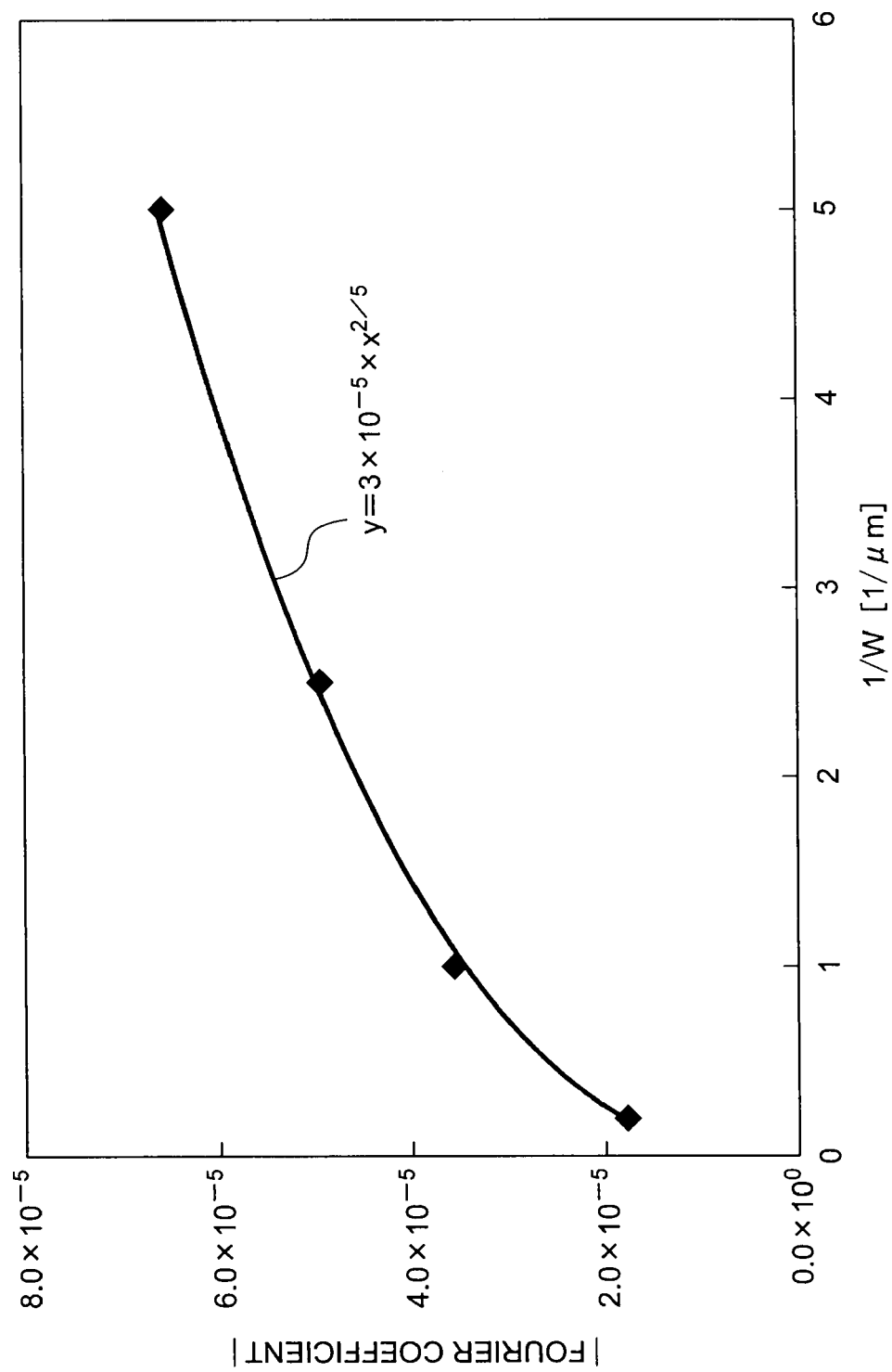
FIG. 9 shows the dependence of the current fluctuations on the channel width in a random noise generating element.

Next, the dependence of the absolute value of the Fourier coefficient on the channel width W at a frequency of 250 Hz was examined, and the result is shown in FIG. 9. In FIG. 9, the abscissa axis indicates the inverse 1/W of the channel width W, and the ordinate axis indicates the absolute value of the Fourier coefficient. In the random noise generating element 10a used in this experiment, the channel length L was 0.06 μm, the film thickness T of the tunnel insulating film 13 was 0.7 nm, and the atom number ratio Si/N between Si and N in the trap insulating film 14 was 1. The graph shown in FIG. 9 is expressed as: $y=3 \times 10^{-5} \times x^{2/5}$, where the value represented by the abscissa axis is x [μm$^{-1}$], and the value represented by the ordinate axis is y [AHz$^{1/2}$]. Accordingly, the current fluctuation components of random noise are proportional to $W^{-2/5}$. In this experiment, the Fourier coefficient was the value obtained at the frequency of 250 Hz. However, the inventors confirmed the fact that the characteristics of the current fluctuation components of random noise being proportional to $W^{-2/5}$ did not depend on the frequency.

Figure 10:
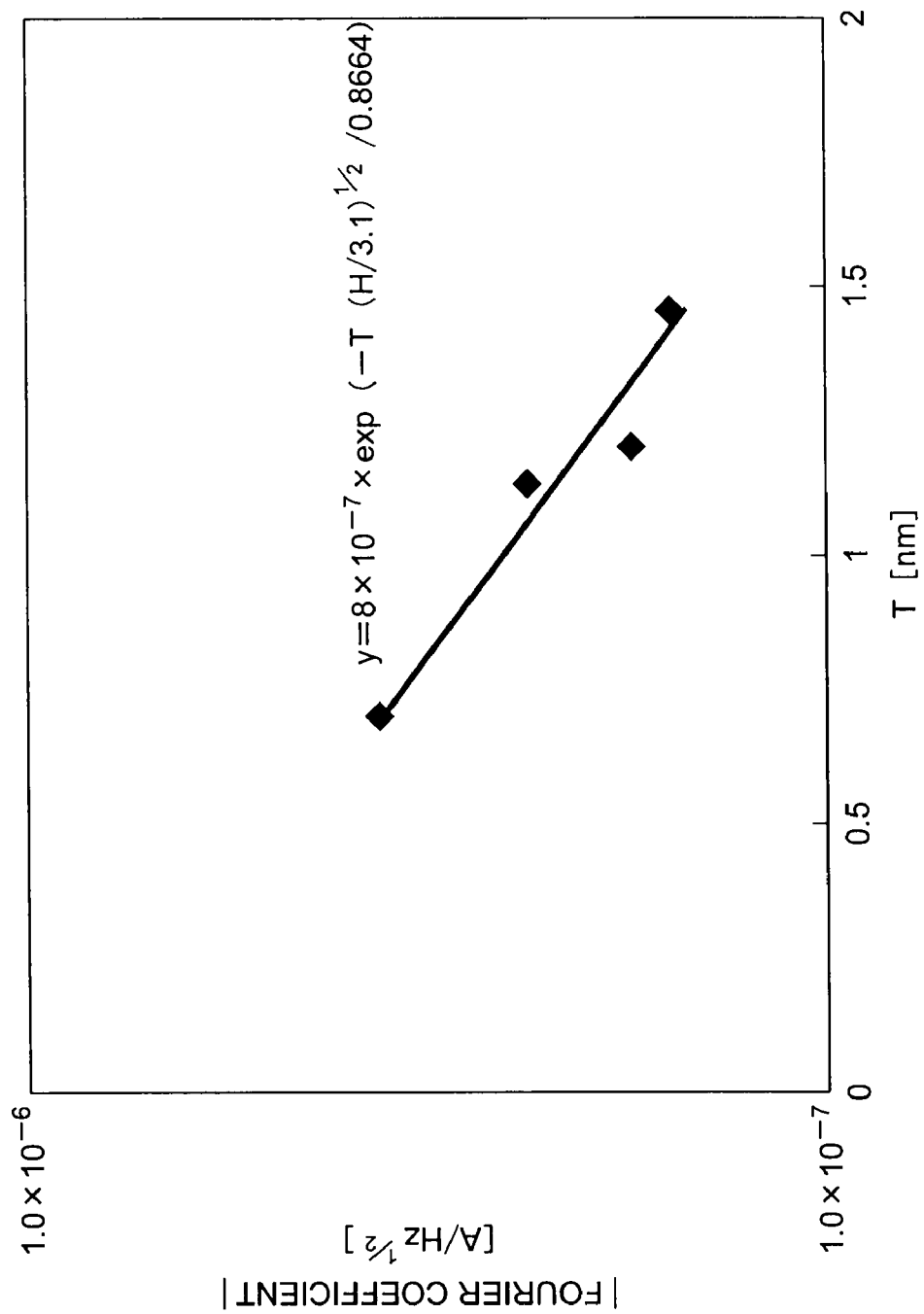
FIG. 10 shows the dependence of the current fluctuations on the film thickness of the tunnel insulating film in a random noise generating element.

Next, the dependence of the absolute value of the Fourier coefficient on the film thickness T of the tunnel insulating film 13 at a frequency of 250 Hz was examined, and the result is shown in FIG. 10. In FIG. 10, the abscissa axis indicates the film thickness T of the tunnel insulating film 13, and the ordinate axis indicates the absolute value of the Fourier coefficient. In the random noise generating element 10a used in this experiment, the channel length L was 0.06 μm, the channel width W was 0.15 μm, and the atom number ratio Si/N between Si and N in the trap insulating film 14 was 1. The graph shown in FIG. 10 is expressed as: $y=8\times10^{-7}\times\exp(-T\{H/3.1\}^{1/2}/0.8664)$, where the value represented by the abscissa axis is T [nm], the value represented by the ordinate axis is y [AHz$^{1/2}$], and H represents the barrier height [eV] between the semiconductor substrate and the tunnel insulating film 13. Accordingly, the current fluctuation components of random noise are proportional to $\exp(-T\{H/3.1\}^{1/2}/0.8664)$. In this experiment, the Fourier coefficient was the value obtained at the frequency of 250 Hz. However, the inventors confirmed the fact that the characteristics of the current fluctuation components of random noise being proportional to $\exp(-T/0.8664)$ did not depend on the frequency.

Figure 11:
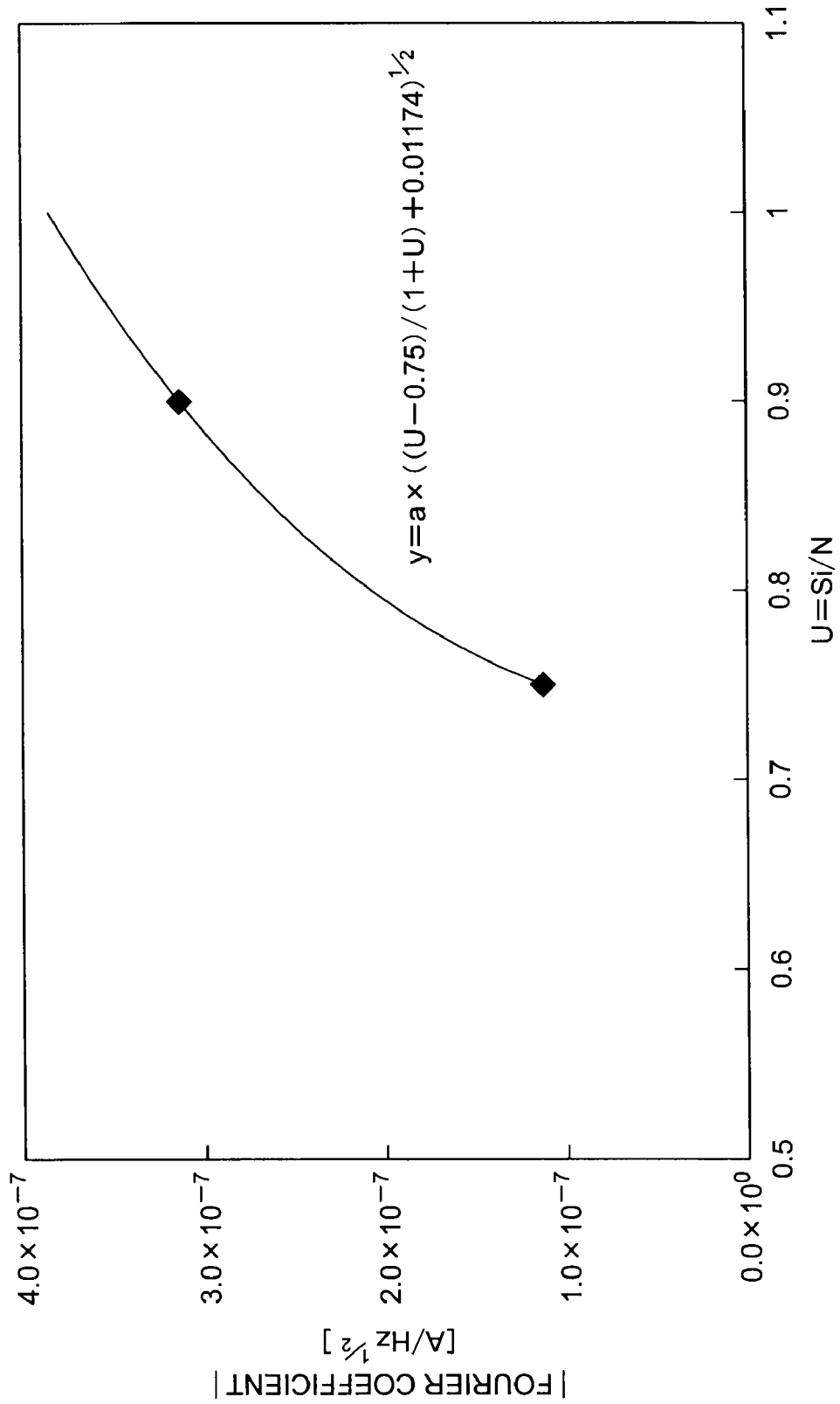
FIG. 11 shows the dependence of the current fluctuations on the atom number ratio between the Si atoms and the N atoms in the trap insulating film.

Next, the dependence of the absolute value of the Fourier coefficient on the atom number ratio U (=Si/N) between the Si atoms and the N atoms in the trap insulating film 14 formed with a silicon nitride film ($Si_UN$, U>0.75) at a frequency of 300 Hz was examined, and the result is shown in FIG. 11. In FIG. 11, the abscissa axis indicates the atom number ratio U between the Si atoms and the N atoms in the trap insulating film 14, and the ordinate axis indicates the absolute value of the Fourier coefficient. In the random noise generating element 10a used in this experiment, the channel length L was 0.06 μm, the channel width W was 0.15 μm, and the film thickness T of the tunnel insulating film 13 was 0.07 nm. According to a theoretical model, the graph shown in FIG. 11 is expressed as: $y=a\times((U-0.75)/(1+U)+0.01174)^{1/2}$, where the value represented by the abscissa axis is U, the value represented by the ordinate axis is y [AHz$^{1/2}$], and a is a constant. This theoretical model was formed based on the concept that fluctuations were proportional to (the number of overlaps (trap density))$^{1/2}$ according to the central limiting theorem of statistics. Here, the trap density is the number of dangling bonds per atom. Since the silicon nitride film is stoichiometric having U=0.75 with respect to the number of atoms (1+U) in the silicon nitride film $Si_UN$, the number of dangling bonds per atom is (U−0.75)/(1+U). Accordingly, the behavior of the Fourier coefficient with respect to the atom number ratio (the number of dangling bonds per atom) is represented by the above described theoretical model. Here, $a\times0.01174^{1/2}$ observed when U is 0.75 is a guide of the noise intensity that can be obtained stoichiometrically. In this experiment, the Fourier coefficient was the value obtained at the frequency of 300 Hz. However, the inventors confirmed the fact that the current fluctuation components of random noise were represented by the above expression, and the expression did not depend on the frequency. The experiment data shown in FIGS. 3 to 11 are the results the inventors obtained through experiments.

Next, the conditions for the current fluctuation components (Fourier coefficient) of the drain current to have 1-MHz fluctuation components at a rate of 0.1% or higher with the respective parameters are described. The frequency dependence of the Fourier coefficient observed in a case where the gate length L is 0.06 μm, the channel width (gate width) W is 0.15 μm, the film thickness T of the tunnel insulating film is 0.7 nm, and the atom number ratio Si/N between the Si atoms and the N atoms in the trap insulating film is 1, is shown in FIG. 7, as already described. Since the regression analysis equation of the Fourier coefficient (the equation represented by the straight line g1 in FIG. 7) is expressed as |Fourier coefficient|$=0.0006f^{-0.4705}$, the value of the Fourier coefficient that achieves the 0.10% fluctuation components can be estimated. However, this regression analysis equation of the Fourier coefficient is applied only when the frequency is 100 Hz or higher. The dependence of the absolute value of the Fourier coefficient on the four parameters is the product C of the characteristics with respect to the respective parameters, and the product C is expressed as: $C=((U-0.75)/(1+U)+0.01174)^{1/2}\times\exp(-T\{H/3.1\}^{1/2}/0.8664)/LW^{2/5}$. When the parameters are equivalent to the conditions shown in FIG. 6, C is 5.8678 [μm$^{-7/5}$]. Also, according to the regression analysis equation shown in FIG. 7, when the rate of the fluctuation components at the frequency of 1 MHz is approximately 0.16%, and when the product C of the characteristics with respect to the respective parameters is larger than 0.1/0.16 of the value C=5.8678, which is determined by assigning the values of the respective parameters shown in FIG. 7, the fluctuation components at 1 MHz are contained at the rate of 0.10% or higher. In other words, the fluctuation components at 1 MHz are contained at the rate of 0.10% or higher, where the following equation (1) is satisfied:

$$[(U-0.75)/(1+U)+0.01174]^{1/2}\times\exp(-T\{H/3.1\}^{1/2}/0.8664)/LW^{2/5} \geq 5.8678/1.6 = 3.67[\mu m^{-7/5}] \quad (1)$$

The trap insulating film 14 of the random noise generating element 10a used in the above experiments was a Si nitride film containing excess Si. However, it is considered that the same behaviors as above can be observed in a random noise generating element that has a Si-rich oxynitride film ($Si_x(SiO_2)_y(Si_3N_4)_{1-y}$, x>0, 1≧y≧0).

A Si-rich nitride film has a stoichiometric composition of $Si_3N_4$. Therefore, the number of Si dangling bonds per atom in $Si_UN$ is (U−0.75)/(U+1), and is 0.125 where Si/N is 1 and U is 1. Meanwhile, a Si-rich oxynitride film ($Si_x(SiO_2)_y(Si_3N_4)_{1-y}$, x>0, 1≧y≧0) becomes stoichiometric where x is 0. Here, the number of excess Si atoms per atom is x/(x+7−4y), and dangling bonds are formed when one excess Si atom having four atomic bonding hands is replaced with an N atom having three atomic bonding hands and an O atom having two atomic bonding hands. The probability that an excess silicon atom is replaced with N and O atoms is determined by the atom number ratio between N and O. One dangling bond is formed when one excess Si atom is replaced with one N atom having three atomic bonding hands. Two dangling bonds are formed when one excess Si atom is replaced with 0 atoms having two atomic bonding hands. Accordingly, the number of dangling bonds per atom is $x/(x+7-4y)\times[(4-4y)/(4-2y)+\{2y/(4-2y)\}\times2]$. The number of Si dangling bonds per atom is $x/(x+7-4y)\times[(4-4y)/(4-2y)+\{2y/(4-2y)\}\times2]=0.125$. To satisfy the equation, x is 15/29, where y is 0.5.

In a case where the gate length L [μm], the channel width (gate width) W [μm], the film thickness T [nm] of the tunnel insulating film 13, and the atom number ratios x and y (x>0, 1≧y≧0) have arbitrary values, a random noise generating element that can generate random numbers containing 1-MHz fluctuation components at 0.1% or more is obtained, if the following equation (2) is satisfied:

$$[x/(x+7-4y)\times\{(4-4y)/(4-2y)+2y/(4-2y)\times2\}+0.01174]^{1/2}\times\exp(-T\{H/3.1\}^{1/2}/0.8664)/LW^{2/5} \geq 3.67[\mu m^{-7/5}] \quad (2)$$

In a more general case where M represents an element other than Si, O, and N, and the trap insulating film 14 is expressed as $Si_x(SiO_2)_y(Si_3N_4)_{1-y}M_z$ (x>0, 1≧y≧0, z≧0), the following equation (3) should be satisfied:

$$[x/(x+7-4y+z)\times\{(4-4y)/(4-2y)+2y/(4-2y)\times2\}+0.01174]^{1/2}\times\exp(-T\{H/3.1\}^{1/2}/0.8664)/LW^{2/5} \geq 3.67[\mu m^{-7/5}] \quad (3)$$

Also, the tunnel insulating film may be removed (T=0 in the above equation).

So far, random noise generating elements that generate 1-MHz random noise components at 0.1% or more have been described. In a small-sized terminal such as a portable telephone device, the frequency of the clock to be used should preferably be lower in the neighborhood of 100 MHz. To cause oscillations at 1 MHz with the use of a multivibrator, it is preferable that the fluctuation components in the 1-μs cycle are 10 ns (the inverse of the clock frequency of 100 MHz) or more, which is 1%. In a case where the fastest clock is used, random oscillation signals that are output from a multivibrator are counted, and "1" and "0" are output, it is possible to count the random oscillation signals and output "1" and "0" when the oscillation frequency of the multivibrator is higher than 1 MHz. As described above with reference to FIG. 7, the regression analysis equation (the equation represented by the straight line g1 in FIG. 7) is |Fourier coefficient|=0.0006f$^{-0.4705}$, and the experiment values indicate that the fluctuation components at 1 MHz are approximately 0.16%. For example, when the frequency characteristics of the Fourier coefficient satisfy |Fourier coefficient|=0.00375f$^{-0.4705}$, which is a regression line equation (with 1/0.16 of the right-hand side of g1) that has the same gradient as the regression analysis equation of the Fourier coefficient and generates 1% fluctuation components at 1 MHz, it is possible to expect 1-ns fluctuation components at approximately 400 MHz. Accordingly, 1% fluctuation components should be obtained at 1 MHz, to expect random number generation at a higher speed.

As in the above described case where 1-MHz fluctuation components are contained at the rate of 0.1%, in a case where 1-MHz fluctuation components are contained at the rate of 1%, and the gate length L [μm], the gate width W [μm], the film thickness T [nm] of the tunnel insulating film, the barrier height H [eV] between the semiconductor substrate and the tunnel insulating film, and the atom number ratios x and y (x>0, 0≦y≦1) of the trap insulating film 14 have arbitrary values, a random noise generating element that can generate random numbers containing 1-MHz fluctuation components at 1% or more is obtained, if the following equation (4) is satisfied:

$$[x/(x+7-4y)\times\{(4-4y)/(4-2y)+2y/(4-2y)\times 2\}+ 0.01174]^{1/2}\times\exp(-T\{H/3.1\}^{1/2}/0.8664)/LW^{2/5} \geqq 36.7[\mu m^{-7/5}] \quad (4)$$

In a more general case where M represents an element other than Si, O, and N, and the trap insulating film is expressed as $Si_x(SiO_2)_y(Si_3N_4)_{1-y}M_z$ (x>0, 1≧y≧0, z≧0), the following equation (5) should be satisfied:

$$[x/(x+7-4y+z)\times\{(4-4y)/(4-2y)+2y/(4-2y)\times 2\}+ 0.01174]^{1/2}\times\exp(-T\{H/3.1\}^{1/2}/0.8664)/LW^{2/5} \geqq 36.7[\mu m^{-7/5}] \quad (5)$$

In some usage cases, the random generating rate does not need to be so high. In such cases, this embodiment can also be used. As in the above described case where 1-MHz fluctuation components are contained at the rate of 0.1%, in a case where 1-MHz fluctuation components are contained at the rate of 0.01%, and the gate length L [μm], the channel width (gate width) W [μm], the film thickness T [nm] of the tunnel insulating film, and the atom number ratios x and y (x>00≧y≧1) have arbitrary values, a random noise generating element that can generate random numbers containing 1-MHz oscillation components at 0.01% or more is obtained, if the following equation (6) is satisfied:

$$[x/(x+7-4y)\times\{(4-4y)/(4-2y)+2y/(4-2y)\times 2\}+ 0.01174]^{1/2}\times\exp(-T\{H/3.1\}^{1/2}/0.8664)/LW^{2/5} \geqq 0.37[\mu m^{-7/15}] \quad (6)$$

In a more general case where M represents an element other than Si, O, and N, and the trap insulating film is expressed as $Si_x(SiO_2)_y(Si_3N_4)_{1-y}M_z$ (x>0, 1≧y≧0, z≧0), the following equation (7) should be satisfied:

$$[x/(x+7-4y+z)\times\{(4-4y)/(4-2y)+2y/(4-2y)\times 2\}+ 0.01174]^{1/2}\times\exp(-T\{H/3.1\}^{1/2}/0.8664)/LW^{2/5} \geqq 0.37[\mu m^{-7/5}] \quad (7)$$

Those are the conditions to be satisfied in random noise generating elements when a fixed voltage is applied to the gate electrode 16 of each random noise generating element 10a.

In a case where a random noise generating element that does not obtain 1-MHz fluctuation components at the rate of 0.1% or higher when a fixed voltage is applied to the random noise generating element is used, the random noise generated by applying a pulse voltage can achieve the above value.

The following is a description of the effect of application of a pulse voltage to the gate electrode 16 of a random noise generating element 10a, and the conditions for the random noise generated from the random noise generating element 10a to have 1-MHz fluctuation components at 0.01% or more, 0.1% or more, or 1% or more.

As described above, the random noise obtained when a pulse voltage is applied to the gate electrode 16 of a random noise generating element 10a is three times as large as the random noise obtained when the gate voltage is fixed, as can be seen from FIG. 5 showing the frequency characteristics of the fluctuations of the drain current $I_d$. The straight line 92 in FIG. 7 is obtained by regression analysis carried out on the size of the random noise obtained when a pulse voltage is applied to the gate electrode 16 of the random noise generating element 10a as in this embodiment, or the size of the absolute value of the Fourier coefficient. In the random noise generating element 10a used in the analysis, the gate length L was 0.06 μm, the gate width W was 0.15 μm, the film thickness T of the tunnel insulating film 13 was 0.7 nm, and the atom number ratio Si/N in the trap insulating film 14 formed with a silicon nitride film was 1.

As can be seen from FIG. 6, the drain current fluctuations when a fixed voltage is applied to the gate electrode have 150% current fluctuation components in the neighborhood of 10 μA. As can be seen from FIG. 7, the current fluctuation components at 1 MHz are approximately 0.160%. Accordingly, the requirement that the fluctuation components at 1 MHz should be 0.1% or more is satisfied. When a pulse voltage is applied to the gate electrode, fluctuation components three times as large as those of the other case can be obtained. Where a pulse voltage is applied to the gate electrode at the same frequencies as above, the current fluctuation components observed at 1 MHz are approximately 0.480%. Accordingly, the requirement that the fluctuation components at 1 MHz should be 0.10% or more is satisfied. It is also considered that the effect of a pulse voltage applied to the gate electrode does not have the frequency dependence, since a very thin tunnel insulating film is employed.

Next, random noise generating elements 10a having different structure parameters were produced. The characteristics observed in a case where a pulse voltage was applied to the gate electrode 16 of each of those random noise generating elements 10a, and the characteristics observed in a case where a fixed voltage was applied to the gate electrodes 16 were examined. The structure parameters include the gate length L, the channel width (gate width) W, and the film thickness T of the tunnel insulating film. In each of the experiments carried out to measure the dependence on the respective parameters, the cycle of the pulse voltage was 32 ms, and ΔV was 4 V. In each of the random noise generating elements 10a, the film thickness $T_{SiN}$ of the trap insulating film 14 was 5 nm, and the film thickness $T_{top}$ of the control insulating film 15 was 6 nm. Those values are not varied even if the channel length L, the channel width W, and the film thickness T of the tunnel insulating film are varied.

Figure 12:
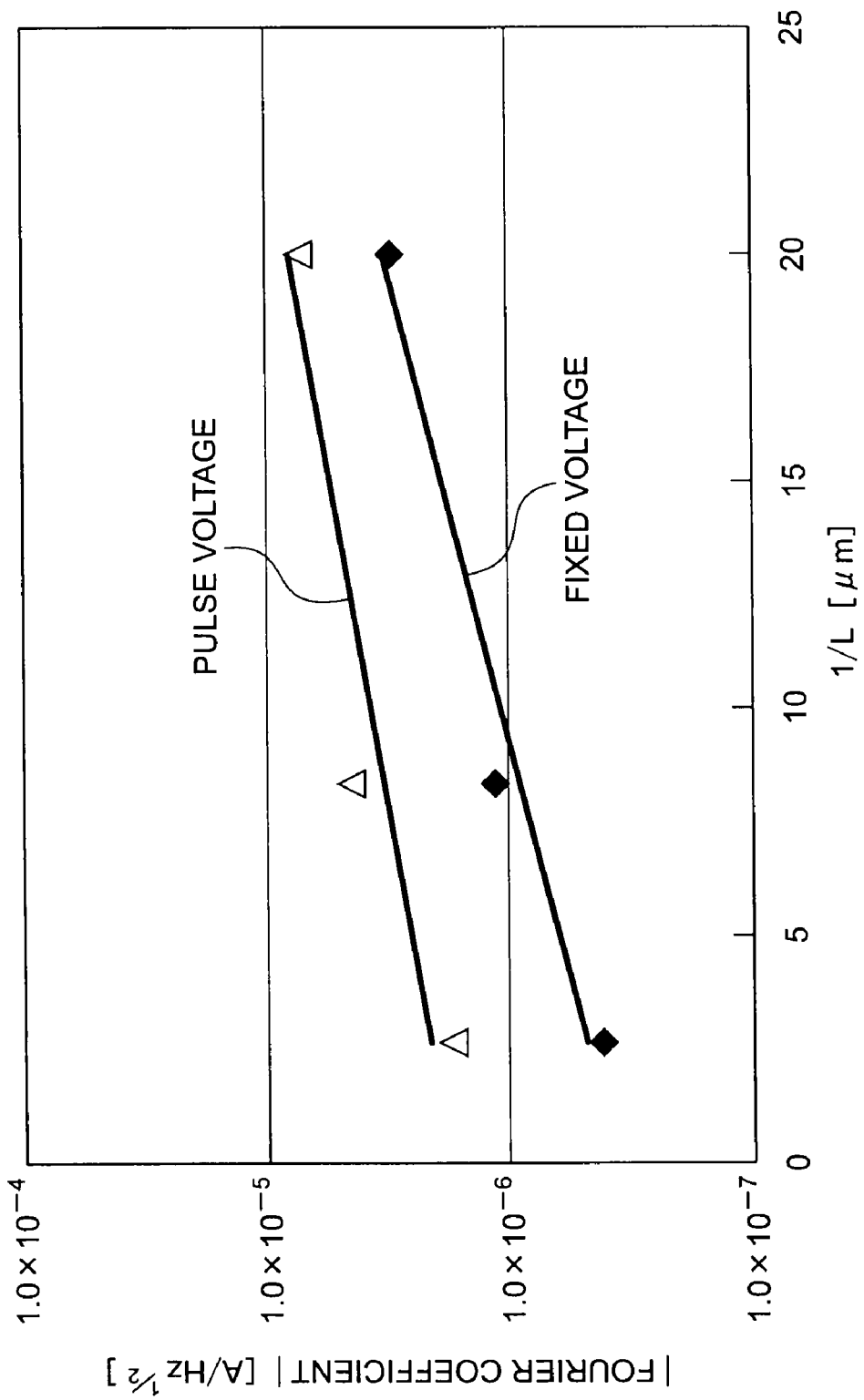
FIG. 12 shows the dependence of the current fluctuations on the channel length in cases where a pulse voltage is applied and where a fixed voltage is applied.

First, the dependence of the Fourier coefficient on the gate length (channel length) L was examined, and the result is shown in FIG. 12. In the random noise generating element used in this experiment, the channel width W was 0.15 μm, the film thickness T of the tunnel insulating film 13 was 0.7 nm, and the atom number ratio Si/N between Si and N in the trap insulating film 14 was 1. The Fourier coefficient shown in FIG. 12 was measured at a frequency of 5 Hz. As can be seen from FIG. 12, the size of the random noise was substantially proportional to the inverse L of the channel length L in both cases where a pulse voltage was applied and where a fixed voltage was applied. However, the random noise obtained when a pulse voltage was applied to the gate electrode was three times as large as the random noise obtained when a fixed voltage was applied to the gate electrode. Here, the random noise obtained when a pulse voltage was applied was random noise in synchronization with the pulse voltage.

Figure 13:
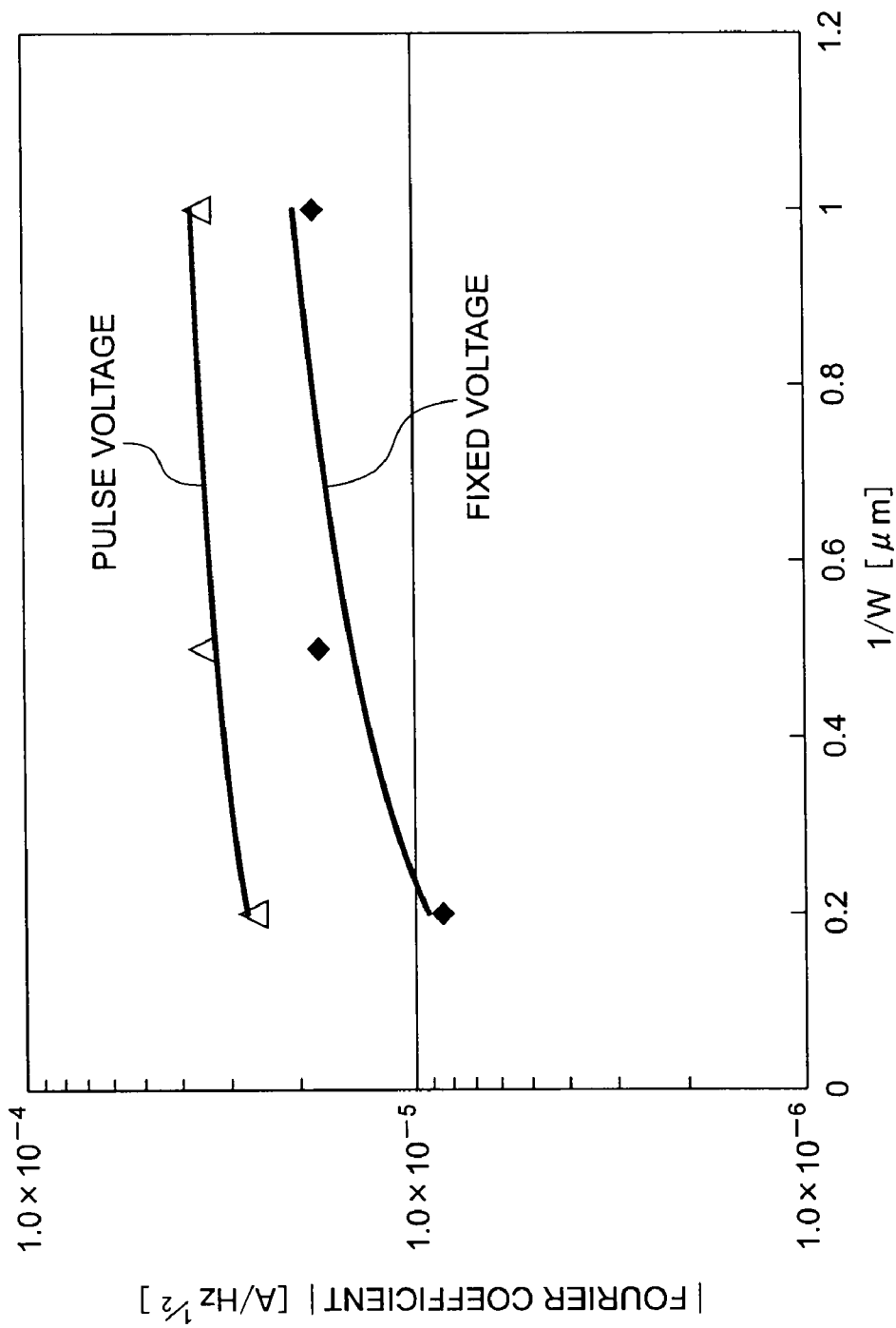
FIG. 13 shows the dependence of the current fluctuations on the channel width in cases where a pulse voltage is applied and where a fixed voltage is applied.

Next, the dependence of the Fourier coefficient on the channel width W was examined, and the result is shown in FIG. 13. In the random noise generating element used in this experiment, the channel length L was 0.12 μm, the film thickness T of the tunnel insulating film 13 was 0.7 nm, and the atom number ratio Si/N between Si and N in the trap insulating film 14 was 1. The Fourier coefficient shown in FIG. 13 was measured at a frequency of 1.5 Hz. As can be seen from FIG. 13, the size of the random noise was proportional to the square of the inverse 1/W of the channel width W in both cases where a pulse voltage was applied and where a fixed voltage was applied. However, the random noise obtained when a pulse voltage was applied to the gate electrode was three times as large as the random noise obtained when a fixed voltage was applied to the gate electrode. Here, the shown random noise obtained when a pulse voltage was applied was random noise in synchronization with the pulse voltage.

Figure 14:
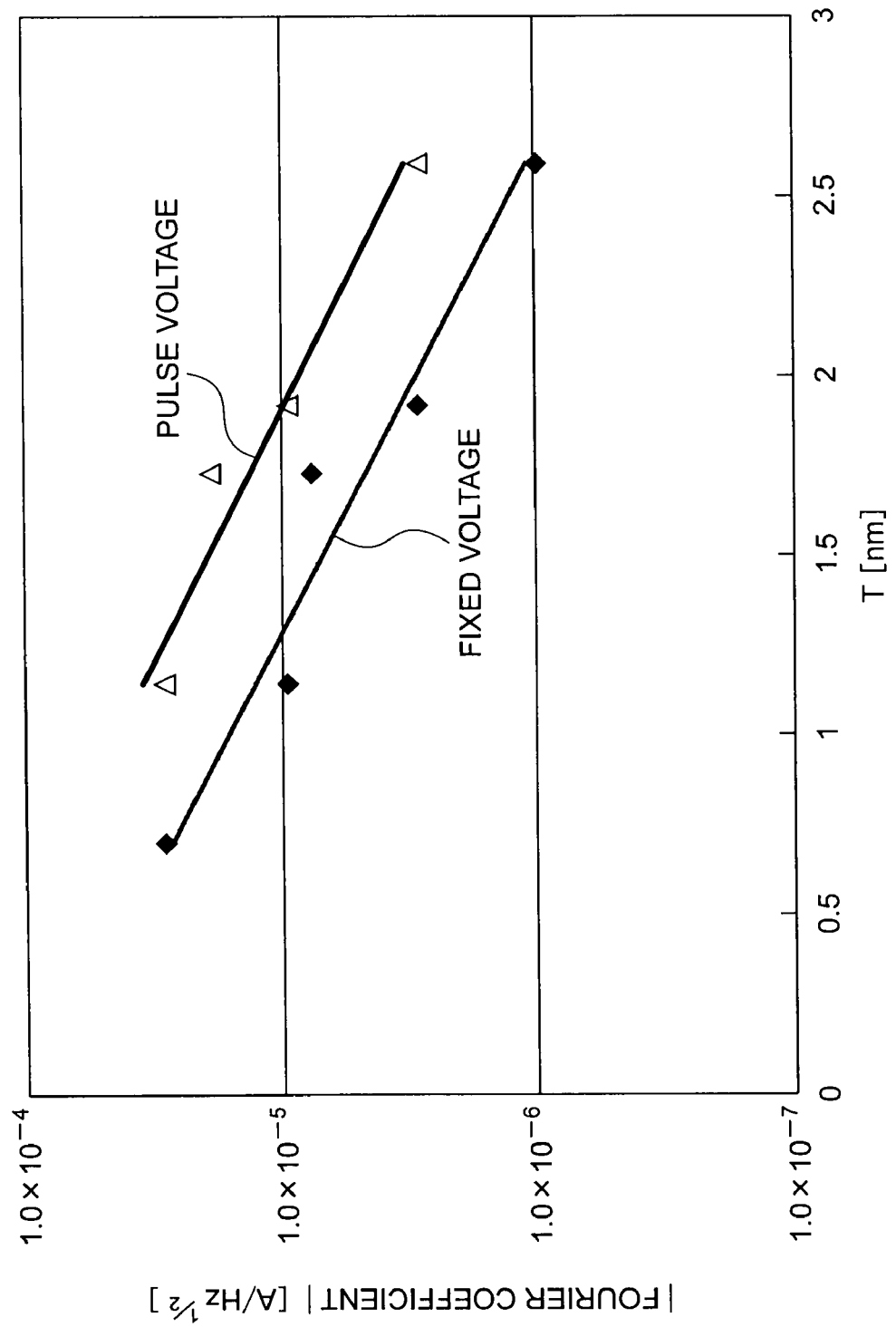
FIG. 14 shows the dependence of the current fluctuations on the film thickness of the tunnel insulating film in cases where a pulse voltage is applied and where a fixed voltage is applied.

Next, the dependence of the Fourier coefficient on the film thickness T of the tunnel insulating film was examined, and the result is shown in FIG. 14. In the random noise generating element 10a used in this experiment, the channel length L was 0.06 μm, the channel width W was 0.15 μm, and the atom number ratio Si/N between Si and N in the trap insulating film 14 was 1. The Fourier coefficient shown in FIG. 14 was measured at a frequency of 1.1 Hz. As can be seen from FIG. 14, the size of the random noise became smaller exponentially with respect to the film thickness T of the tunnel insulating film 13 in both cases where a pulse voltage was applied and where a fixed voltage was applied. However, the random noise obtained when a pulse voltage was applied to the gate electrode was three times as large as the random noise obtained when a fixed voltage was applied to the gate electrode. Here, the random noise obtained when a pulse voltage was applied was random noise in synchronization with the pulse voltage. The experiment data shown in FIGS. 12 to 14 were actually discovered by the inventors through experiments.

Next, the proportion of the fluctuation components contained in the random noise at a frequency of 1 MHz, and the parameter conditions are described.

As already mentioned (see FIG. 7, for example), the absolute value of the Fourier coefficient in the frequency characteristics observed when a fixed voltage is applied to the gate electrode 16 of a random noise generating element 10a in accordance with this embodiment is expressed as:

$$|\text{Fourier coefficient}|=0.0006 f^{-0.4705} \quad (8)$$

Also, as described above (see the straight line g2 in FIG. 7, for example), the absolute value of the Fourier coefficient obtained when a pulse voltage is applied to the gate electrode 16 of a random noise generating element 10a of this embodiment is three times as large as the absolute value of the Fourier coefficient obtained when a fixed voltage is applied to the gate electrode 16. Accordingly, the absolute value of the Fourier coefficient obtained when a pulse voltage is applied to the gate electrode is expressed as:

$$|\text{Fourier coefficient}|=0.0018 f^{-0.4705} \quad (9)$$

As already mentioned, the product C representing the dependence on the respective parameters is expressed as:

$$C=[x/(x+7-4y+z)\times\{(4-4y)/(4-2y)+2y/(4-2y)\times 2\}+ \\ 0.01174]^{1/2}\times\exp(-T\{H/3.1\}^{1/2}/0.8664)/LW^{2/5} \quad (10)$$

The Fourier coefficient of random noise is proportional to the product C. Here, T represents the film thickness [nm] of the tunnel insulating film, and H represents the barrier height [eV] between the semiconductor substrate and the tunnel insulating film. The product C is 5.8678 [μm$^{-7/5}$], when the gate length L is 0.06 μm, the cannel width (gate width) W is 0.15 μm, the film thickness T of the tunnel insulating film is 0.7 nm, and the atom number ratio between the Si atoms and the N atoms in the trap insulating film is 1.

When a fixed voltage is applied to the gate electrode 16 of a random noise generating element 10a used in this embodiment, the proportion of the current fluctuations at 1 MHz is 0.160%. When a pulse voltage is applied to the gate electrode 16 in this embodiment, the current fluctuations can be made three times as large as those of the other case, and the proportion of the current fluctuations at 1 MHz is 0.480% accordingly. In the case where a fixed voltage is applied, the proportion of the current fluctuation components at 1 MHz is 0.10% or larger, if the product C of the characteristics with respect to the respective parameters is larger than 5.87×(0.1/0.16). Accordingly, in this embodiment, the proportion of the current fluctuation components at 1 MHz can be 0.1% or larger, if the product C of the characteristics with respect to the respective parameters is larger than 5.87×(0.1/0.48). In view of this, the conditional equation about the product C of the characteristics with respect to the parameters used in the case where a fixed voltage is applied can also be used in this embodiment by multiplying the right-hand side of the equation by ⅓. The conditional equation obtained in this manner is expressed as:

$$[x/(x+7-4y+z)\times\{(4-4y)/(4-2y)+2y/(4-2y)\times 2\}+ \\ 0.01174]^{1/2}\times\exp(-T\{H/3.1\}^{1/2}/ \\ 0.8664)/LW^{2/5} \geq 3.67/3[\mu m^{-7/5}]=1.22[\mu m^{-7/5}] \quad (11)$$

The required amount of current fluctuation components varies with the experiment conditions. The above equation is used where the proportion of the current fluctuation components is 0.1% or more. In cases where the proportion of the current fluctuation components is 0.01% or larger and where the proportion of the current fluctuation components is 1% or larger, the right-hand side of the above conditional equation used when a fixed voltage is applied should be multiplied by ⅓. First, where the proportion is 0.01% or larger, the conditional equation is expressed as:

$$[x/(x+7-4y+z)\times\{(4-4y)/(4-2y)+2y/(4-2y)\times 2\}+ \\ 0.01174]^{1/2}\times\exp(-T\{H/3.1\}^{1/2}/ \\ 0.8664)/LW^{2/5} \geq 0.37/3[\mu m^{-7/5}]=0.12[\mu m^{-7/5}] \quad (12)$$

and where the proportion is 1% or larger, the conditional equation is expressed as:

$$[x/(x+7-4y+z)\times\{(4-4y)/(4-2y)+2y/(4-2y)\times2\}+0.01174]^{1/2}\times\exp(-T\{H/3.1\}^{1/2}/0.8664)/LW^{2/5} \geq 36.7/3[\mu m^{-7/5}]=12.23[\mu m^{-7/5}] \quad (13)$$

To satisfy the conditional equations (11), (12), and (13), the value of LW can be made larger than the value of LW obtained in the case where a fixed voltage is applied. Accordingly, in accordance with the present invention, a higher degree of freedom is allowed in the design of a random noise generating element, and there is no need to employ a difficult miniaturization technique.

The trap insulating film 14 is expressed as $Si_x(SiO_2)_y(Si_3N_4)_{1-y}M_z$ ($x>0$, $1 \geq y \geq 0$, $z \geq 0$), where M represents an element other than Si, O, and N. However, the same effects as above can be achieved even if x is "0". In such a case, at least one of y and z is not "0".

The conditions for the proportion of the 1-MHz fluctuation components of random noise to be 0.01% or larger, 0.1% or larger, and 1% or larger in the case where the trap insulating film 14 of a random noise generating element 10a is $Si_UN$ ($U \geq 0.75$) are as follows. The composition formula $Si_UN$ ($U \geq 0.75$) is equivalent to the composition formula $Si_x(SiO_2)_y(Si_3N_4)_{1-y}M_z$ ($x \geq 0$, $1 \geq y \geq 0$, $z \geq 0$) where y=z=0 and x=4U−3. Accordingly, y=z=0 and x=4U−3 are assigned in the equations (12), (11), and (13) of the first embodiment. As a result, the following equations (14), (15), and (16) are obtained. Where the proportion is 0.01% or larger, the following equation (14) needs to be satisfied:

$$[(U-0.75)/(1+U)+0.01174]^{1/2}\times\exp(-T\{H/3.1\}^{1/2}/0.8664)/LW^{2/5} \geq 0.12[\mu m^{-7/5}] \quad (14)$$

Where the proportion is 0.1% or larger, the following equation (15) needs to be satisfied:

$$[(U-0.75)/(1+U)+0.01174]^{1/2}\times\exp(-T\{H/3.1\}^{1/2}/0.8664)/LW^{2/5} \geq 1.22[\mu m^{-7/5}] \quad (15)$$

Where the proportion is 1% or larger, the following equation (16) needs to be satisfied:

$$[(U-0.75)/(1+U)+0.01174]^{1/2}\times\exp(-T\{H/3.1\}^{1/2}/0.8664)/LW^{2/5} \geq 12.22[\mu m^{-7/5}] \quad (16)$$

The trap insulating film 14 is formed with a stoichiometric silicon oxynitride film or a nonstoichiometric silicon oxynitride film in the above described embodiment. However, in a case where the trap insulating film 14 is formed only with a nonstoichiometric silicon oxynitride film expressed by the composition formula $Si_x(SiO_2)_y(Si_3N_4)_{1-y}M_z$ ($x \geq 0$, $1 \geq y \geq 0$, $z \geq 0$), to satisfy the conditions for the proportion of the 1-MHz fluctuation components of random noise to be 0.01% or larger, 0.1% or larger, and 1% or larger, the following equations (17), (18), and (19) having the stoichiometric term 0.01174 removed from the equations (12), (11), and (13) are to be satisfied.

Where the proportion is 0.01% or larger, the following equation (17) is to be satisfied:

$$[x/(x+7-4y+z)\times\{(4-4y)/(4-2y)+2y/(4-2y)\times2\}]^{1/2}\times\exp(-T\{H/3.1\}^{1/2}/0.8664)/LW^{2/5} \geq 0.37/3[\mu m^{-7/5}]=0.12[\mu m^{-7/5}] \quad (17)$$

Where the proportion is 0.1% of larger, the following equation (18) is to be satisfied:

$$[x/(x+7-4y+z)\times\{(4-4y)/(4-2y)+2y/(4-2y)\times2\}]^{1/2}\times\exp(-T\{H/3.1\}^{1/2}/0.8664)/LW^{2/5} \geq 3.67/3[\mu m^{-7/5}]=1.22[\mu m^{-7/5}] \quad (18)$$

Where the proportion is 1% or larger, the following equation (19) is to be satisfied:

$$[x/(x+7-4y+z)\times\{(4-4y)/(4-2y)+2y/(4-2y)\times2\}]^{1/2}\times\exp(-T\{H/3.1\}^{1/2}/0.8664)/LW^{2/5} \geq 36.7/3[\mu m^{-7/5}]=12.23[\mu m^{-7/5}] \quad (19)$$

Referring back to FIG. 1, the random generating device of this embodiment is described.

When the pulse voltage 75 generated from the pulse voltage generator 70 is applied to the gate electrode 16 of the random noise generating element 10a, a random noise signal (a voltage signal that has the same cycle as the pulse voltage 75 and exhibits amplitude having a random level) is generated from the connection node between the random noise generating element 10a and the resistor 10b. This random noise signal is input to the buffer circuit 20. An output signal from the buffer circuit 20 is input to one terminal of the comparator 30. The reason that the buffer circuit 20 is provided is as follows. If the random noise generating element 10a is connected directly to the comparator 30, proper random noise might not be obtained due to adverse influence of the comparator 30. Therefore, to shut off the influence of the comparator 30, the buffer circuit 20 is provided. Also, a voltage signal that is a reference voltage $V_{ref}$ is supplied to the other terminal of the comparator 30.

The comparator 30 performs a comparison between two signals that are input to the comparator 30, and outputs a high-level signal or a low-level signal. The value of the reference voltage $V_{ref}$ is set at a value substantially equal to the mean value of signals that are output from the buffer circuit 20. With this arrangement, the random signals that are output from the comparator 30 have the value "1" and "0" at the same rates. However, the output level of the comparator 30 might become insufficient, depending on the size of the signal that is input to the comparator 30 or the rate of change of input signals. To counter such problems, the buffer circuit 40 is provided on the output side of the comparator 30 in this embodiment. The buffer circuit 40 amplifies the output of the comparator 30, to obtain a desired voltage level. The output signal from the buffer circuit 40 is input to the latch circuit 60 formed with a D-flip-flop, and is latched with an appropriate clock signal, so as to generate a random number. The clock signal that is input to the latch circuit 60 here may be acquired from the pulse voltage generator 70 that generates the pulse voltage to be applied to the gate electrode 16 of the random noise generating element 10a. At this point, to match the timing of the signal that is output through the buffer circuit 40 with the timing of the clock signal, the clock 75 is input to the clock terminal of the latch circuit 60 via the timing circuit 50 formed with an inverter or the like.

Figure 15A:
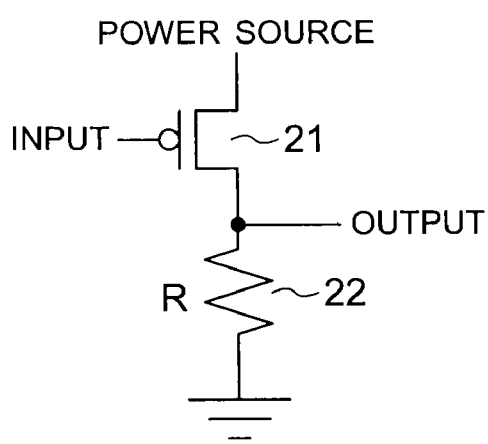
FIGS. 15A and 15B are circuit diagrams illustrating specific examples of buffer circuits according to the first embodiment.
Figure 15B:
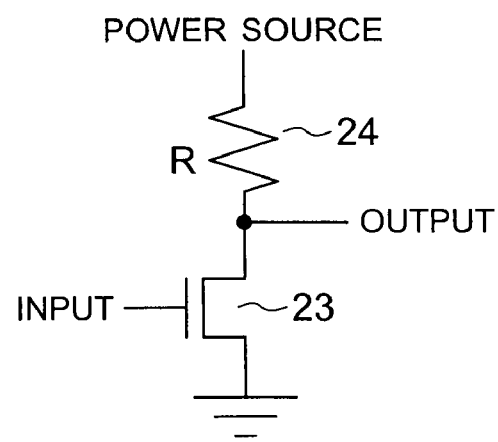

The buffer circuit 20 may have circuit structures shown in FIGS. 15A and 15B, for example. In the specific example shown in FIG. 15A, the buffer circuit 20 is formed with a p-type MOSFET 21 and a resistor 22 that are connected in series. In the other specific example shown in FIG. 15B, the buffer circuit 20 is formed with an n-type MOSFET 23 and a resistor 24 that are connected in series.

Figure 16:
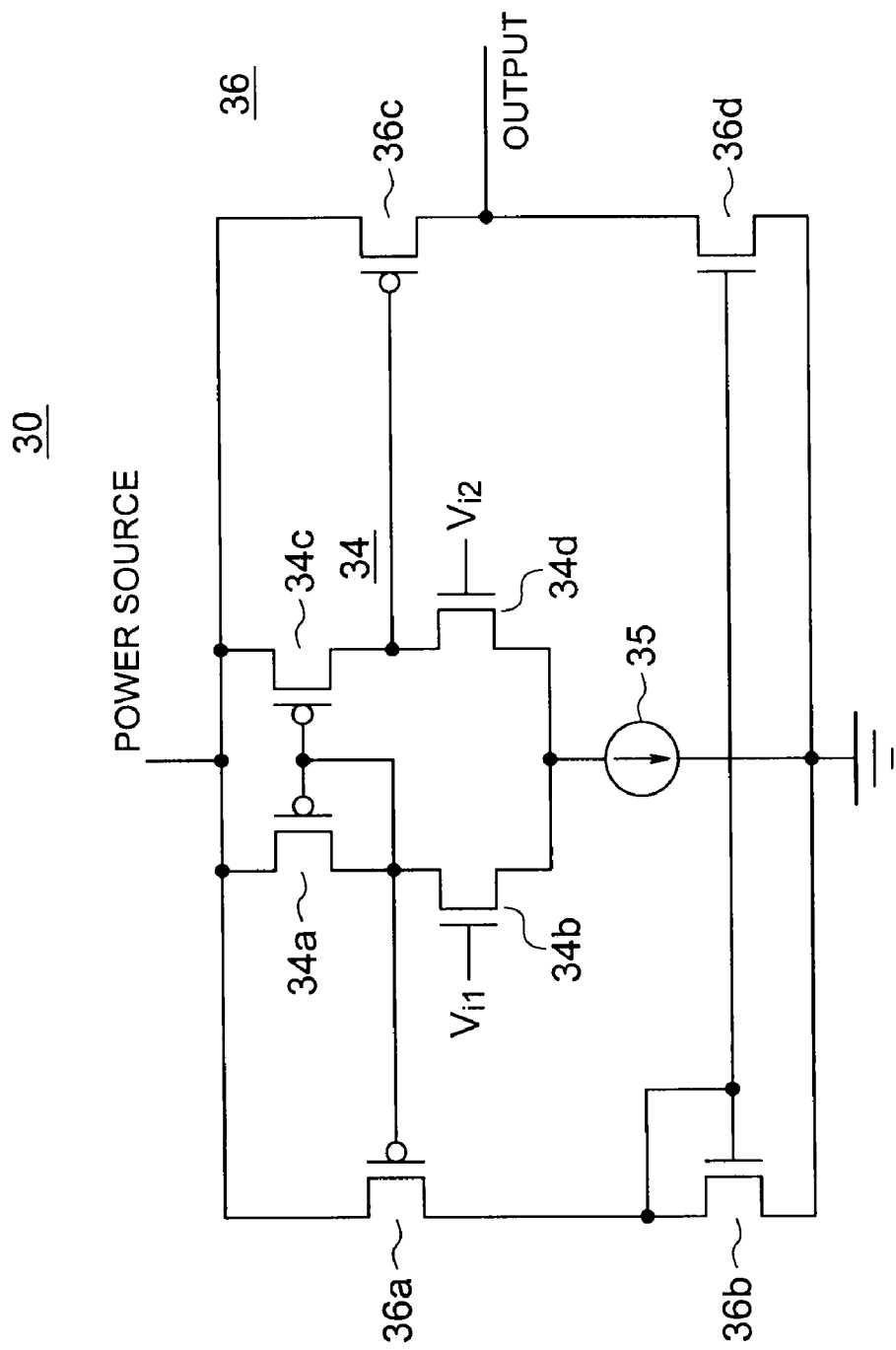
FIG. 16 is a circuit diagram illustrating a specific example of a comparator according to the first embodiment.

FIG. 16 illustrates a specific example of the comparator 30. The comparator 30 of this example includes a differential amplifier 34, a current source 35, and an output unit 36. The differential amplifier 34 includes a p-type MOSFET 34a and an n-type MOSFET 34b that are connected in series, and a p-type MOSFET 34c and an n-type MOSFET 34d that are connected in series. The output unit 36 includes a p-type MOSFET 36a and an n-type MOSFET 36b that are connected in series, and a p-type MOSFET 36c and an n-type MOSFET 36d that are connected in series. The drains of the p-types MOSFETs 34a, 34c, 36a, and 36c are connected to the power source. The gate of the p-type MOSFET 36a is connected to the connection node between the p-type MOSFET 34a and the n-type MOSFET 34b. The gate of the p-type MOSFET 36c is connected to the connection node between the p-type MOSFET 34c and the n-type MOSFET 34d. The sources of the n-type MOSFETs 34b and 34d are connected to each other and are grounded via the current source 35. The n-type MOSFETs 36b and 36d have the respective gates connected to the common connection node of the p-type MOSFET 36a and the n-type MOSFET 36b, and have the respective drains grounded. A first input voltage $V_{i1}$ is input to the gate of the n-type MOSFET 34b of the differential amplifier 34, and a second input voltage $V_{i2}$ is input to the gate of the n-type MOSFET 34d. An output voltage is output from the common connection node of the p-type MOSFET 36c and the n-type MOSFET 36d. If the first input voltage $V_{i1}$ is higher than the second input voltage $V_{i2}$, the output voltage is a low-level voltage. If the second input voltage $V_{i2}$ is higher than the first input voltage $V_{i1}$, the output voltage is a high-level voltage. In a case where the difference between the first input voltage $V_{i1}$ and the second input voltage $V_{i2}$ is small, or where the voltage is distributed to areas with low sensitivity, the output voltage is not a complete high-level or low-level voltage. In such cases, the buffer circuit 40 is connected to the output stage of the comparator 30.

Figure 17:
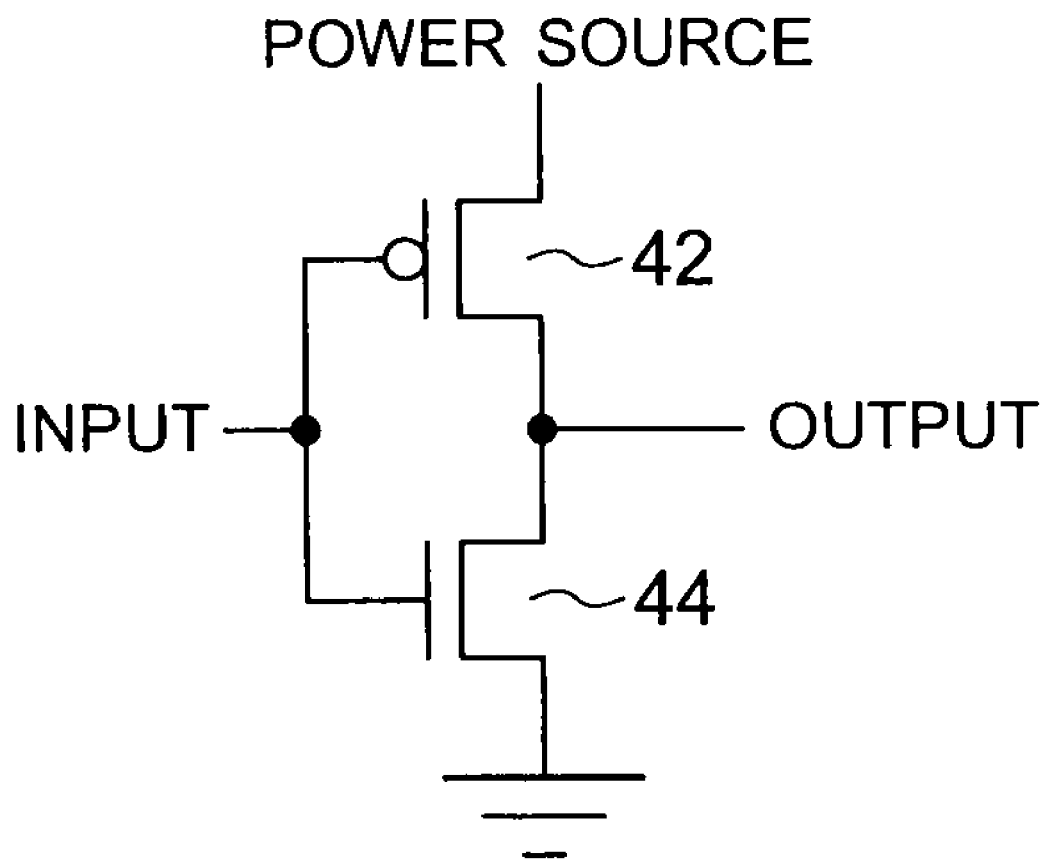
FIG. 17 is a circuit diagram illustrating a specific example of a buffer circuit according to the first embodiment.

FIG. 17 shows a specific example structure of the buffer circuit 40. The buffer circuit 40 of this specific example is an inverter circuit that includes a p-type MOSFET 42 and an n-type MOSFET 44. The buffer circuit 40 amplifies the output of the comparator 30, so as to obtain a digital signal having a sufficient voltage level.

The random number generating device of this embodiment has the random noise generating element 10a in which a pulse voltage is applied to the gate electrode 16 as shown in FIG. 2. Accordingly, it is possible to generate random numbers at a high speed. The number of inverters employed in the buffer circuit 40 is adjusted so that an optimum random number generating device capable of coping with the proportion of the fluctuation components at 1 MHz can be obtained.

The voltage to be applied to the gate electrode 16 of the random noise generating element 10a depends on the silicon bandgap. Accordingly, if the fluctuations of the voltage that is output from the random noise generating element 10a, that is, the fluctuations of the voltage that is output from the connection node between the random noise generating element 10a and the resistor 10b which correspond the fluctuations of the current of the random noise generating element 10a are of 10 mV, the proportion of the fluctuation components is approximately 1% of the input voltage. Likewise, if the fluctuations of the voltage that is output from the random noise generating element 10a are of 1 mV, the proportion of the fluctuation components is approximately 0.1% of the input voltage. If the fluctuations of the voltage that is output from the random noise generating element 10a are of 0.1 mV, the proportion of the fluctuation components is approximately 0.01% of the input voltage. The gain of the operation amplifier forming the comparator 30 is typically 100 at 1 MHz. Accordingly, if the voltage fluctuation is of 10 mV or so, digital random number signals can be acquired without the use of the buffer circuit 40. If the voltage fluctuations are of 0.1 mV, one inverter is provided as the buffer circuit 40, so as to obtain digital random number signals. If the voltage fluctuations are of 0.01 mV, two inverters connected in series are provided as the buffer, so as to obtain digital random number signals. The above described facts were also confirmed through circuit simulations.

As described above, in a case where the proportion of the fluctuation components at 1 MHz is 0.01% or more, the output of the comparator 30 is amplified by two inverters, so as to form a small-sized, high-speed random number generating device. In a case where the proportion of the fluctuation components at 1 MHz is 0.1% or more when a fixed voltage is applied to the gate electrode 16 of the random noise generating element 10a, the buffer circuit 40 can be formed with one inverter. With a random noise generating element 10a that can generate random noise having 1% or more fluctuation components at 1 MHz, a small-sized, high-speed random number generating device can be formed without the buffer circuit 40.

As described above, this embodiment can provide a high-performance random number generating device that is capable of generating high-quality random numbers at a high speed.

Second Embodiment

Figure 18:
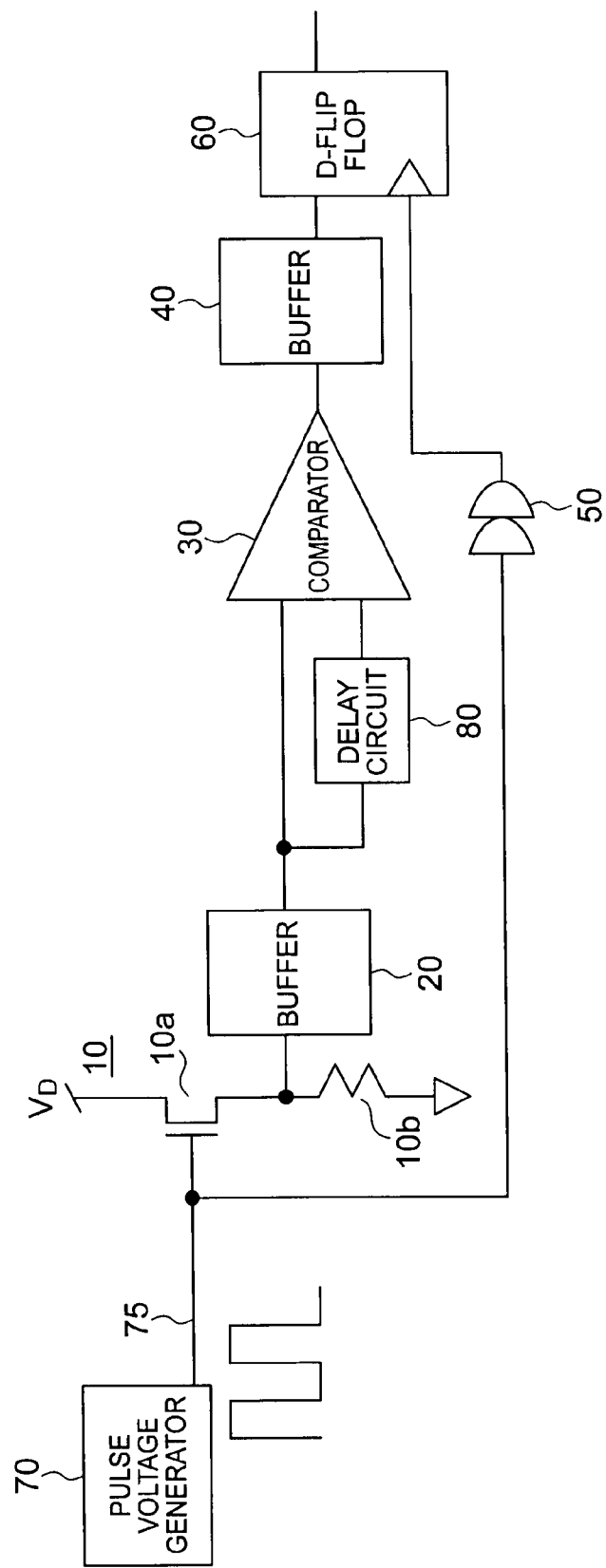
FIG. 18 is a block diagram illustrating a random number generating device according to a second embodiment.

FIG. 18 illustrates a random number generating device in accordance with a second embodiment of the present invention. The random number generating device of this embodiment differs from the random number generating device of the first embodiment shown in FIG. 1 in that a delay circuit 80 to receive the output of the buffer circuit 20 is newly added, and the output of the delay circuit 80 is used as the reference voltage Vref in the comparator 30. The random noise generating element 10a has the same structure as that of the first embodiment, and the pulse voltage 75 generated from the pulse voltage generator 70 is applied to the gate of the random noise generating element 10a.

A random noise signal (a voltage signal that has the same cycle as the pulse voltage 75 and exhibits amplitude having a random level) that is output from the random noise generating element 10a when the pulse voltage 75 is applied to the gate electrode is sent to the buffer circuit 20. The output of the buffer circuit 20 is sent to one of the input terminals of the comparator 30, and is also sent to the delay circuit 80. The delay circuit 80 delays the output of the buffer circuit 20 by the amount equivalent to one cycle or an integral multiple of the cycle, and outputs the delayed signal to the other input terminal of the comparator 30.

The comparator 30 performs a comparison between the two signals that are input to the comparator 30, and outputs a high-level signal or a low-level signal. The two signals to be compared are signals that are output from the same random number source. If the random numbers are at random, the digital random numbers that are output from the comparator 30 include the value "1" and the value "0" randomly, and the probabilities of occurrence of "1" and "0" become equal to each other. However, depending on the size of each signal that is input to the comparator 30, and on the rate of change of the input signals, the output level of the comparator 30 might be insufficient. To counter this problem, the buffer circuit 40 is connected to the comparator 30, as in the first embodiment. The buffer circuit 40 amplifies the output of the comparator 30, so as to achieve a desired voltage level. The output signal from the buffer circuit 40 is input to the latch circuit 60 formed with a D-flip-flop, for example. The latch circuit 60 latches the signal with an appropriate clock, and generates a random number. The clock signal that is input to the latch circuit 60 here may be acquired from the pulse voltage source (the pulse voltage generator 70) of the pulse voltage applied to the gate electrode of the random noise generating element 10a of the random noise source 10. At this point, to match the timing of the clock signal with the timing of the signal that is output through the buffer circuit 40, the clock signal is input to the clock terminal of the latch circuit 60 via the timing circuit 50 formed with an inverter or the like.

As described above, the random noise generating element 10a of the first embodiment is used as the random noise generating element in the random number generating device of this embodiment. Accordingly, the random number generating device of this embodiment can generate high-quality random numbers at a high speed.

Also, as in the first embodiment, the number of inverters to be employed in the buffer circuit 40 is adjusted so as to generate optimum random numbers in accordance with the proportion of the fluctuation components obtained at 1 MHz in the random number generating device of this embodiment. In this embodiment, the reference voltage Vref that is required in the first embodiment as shown in FIG. 1 is not necessary. The reference voltage Vref needs to be set in the neighborhood of the mean voltage of the outputs of the buffer circuit 20, but such arrangement is not necessary in this embodiment.

Third Embodiment

Figure 19:
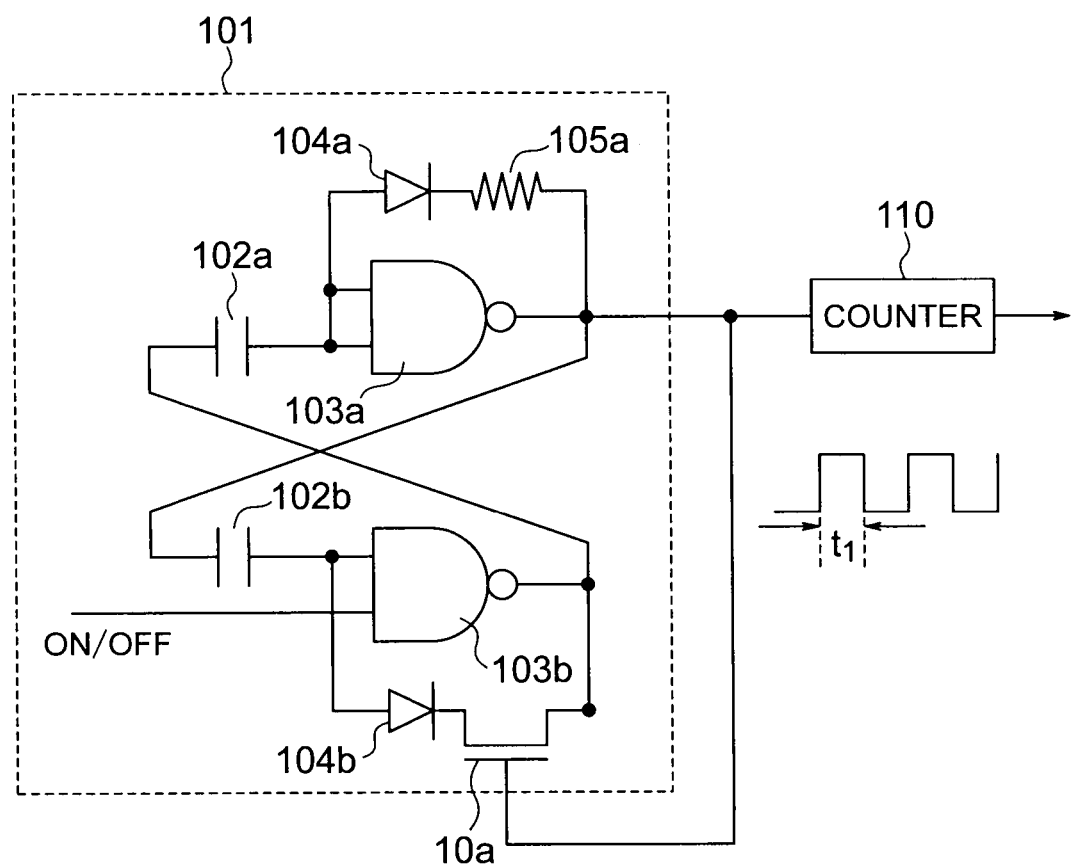
FIG. 19 is a block diagram illustrating a random number generating device according to a third embodiment.

FIG. 19 illustrates a random number generating device in accordance with a third embodiment of the present invention. The random number generating device of this embodiment includes an astable multivibrator 101 and a counter 110. The astable multivibrator 101 includes a capacitor 102a, a NAND circuit 103a, a diode 104a, a feedback resistor 105a, a capacitor 102b, a NAND circuit 103b, a diode 104b, and a random noise generating element 10a. One end of the capacitor 102a is connected to the two input terminals of the NAND circuit 103a and the input terminal of the diode 104a. The output terminal of the diode 104a is connected to one end of the feedback resistor 105a. The other end of the feedback resistor 105a and the output end of the NAND circuit 103a are connected to each other, and are connected to one end of the capacitor 102b. The other end of the capacitor 102b is connected to one input terminal of the NAND circuit 103b and the input terminal of the diode 104b. An ON/OFF signal from the outside is input to the other input terminal of the NAND circuit 103b. One of the source and drain of the random noise generating element 10a is connected to the output end of the diode 104b. The other one of the source and drain of the random noise generating element 10a and the output end of the NAND circuit 103b are connected to each other, and are connected to the other end of the capacitor 102a. In this astable multivibrator 101, one of the feedback resistors normally provided in a multivibrator, or the feedback resistor connected between the output terminal of the diode 104b and the output terminal of the NAND circuit 103b, is replaced with the random noise generating element 10a. The output of the multivibrator 101 (the output of the NAND circuit 103a) is applied to the gate of the random noise generating element 10a. With the astable multivibrator having this structure, signals generated from the multivibrator become random. The oscillation signals that are output from the multivibrator can be increased by virtue of the fluctuating effect of the random noise generating element 10a.

The counter 110 includes a clock enable terminal and a CK terminal. Each random oscillation signal that is output from the multivibrator 101 is input to the clock enable terminal of the counter 110, and a clock generated from a ring oscillator or the like is input to the CK terminal. With this arrangement, the random oscillation signals are counted, and "1" or "0" is output by determining whether the count value is an odd number or an even number.

For example, the multivibrator 101 including the random noise generating element 10a is oscillated at 1 MHz. The fluctuation width of the oscillation cycle of the signals that are output from the multivibrator 101 is counted with a 1-GHz clock with the use of a ring oscillator. With the fluctuation components in 1-μs cycles (at a frequency of 1 MHz) being 1 ns (0.1% of 1 μs) or more, the count values can be turned into digital random numbers from the noise components generated from the random noise generating element 10a, with the use of a 1-GHz clock that is normally considered to be the fastest. As a result, true random numbers can be generated at a random number generating rate of 1 MHz/sec or higher, without an amplifier circuit.

In accordance with this embodiment, the circuit size can be made smaller than in the first and second embodiments.

As described above, the random noise generating element 10a of the first embodiment is used as the random noise generating element in the random number generating device of each of the second and third embodiments. Accordingly, the random number generating device of each of the second and third embodiments can generate high-quality random numbers at a high speed.

Since the same random noise generating element 10a as that of the first embodiment is used in the second and third embodiments, the conditions for the proportion of the 1-MHz fluctuation components in the random noise generated from the random noise generating element 10a to be 0.010% or higher, 0.1% or higher, and 1% of higher are the same as those described in the first embodiment.

Random noise generating elements 10a that can be used in the first to third embodiments are not limited to those described above. The same effects as above can be achieved with a random noise generating element that does not include a tunnel insulating film and has a SiN film placed directly on the substrate (a regular MOSFET having a gate insulating film formed with a SiN film), or a random noise generating element that has a tunnel insulating film formed with a material that is other than $SiO_2$ and has a smaller barrier height. The same effects above can also be achieved with a random noise generating element that does not have the control insulating film 15. Further, it is also possible to achieve the same effects as above, even if the control insulating film 15 is thin.

Fourth Embodiment

Figure 20:
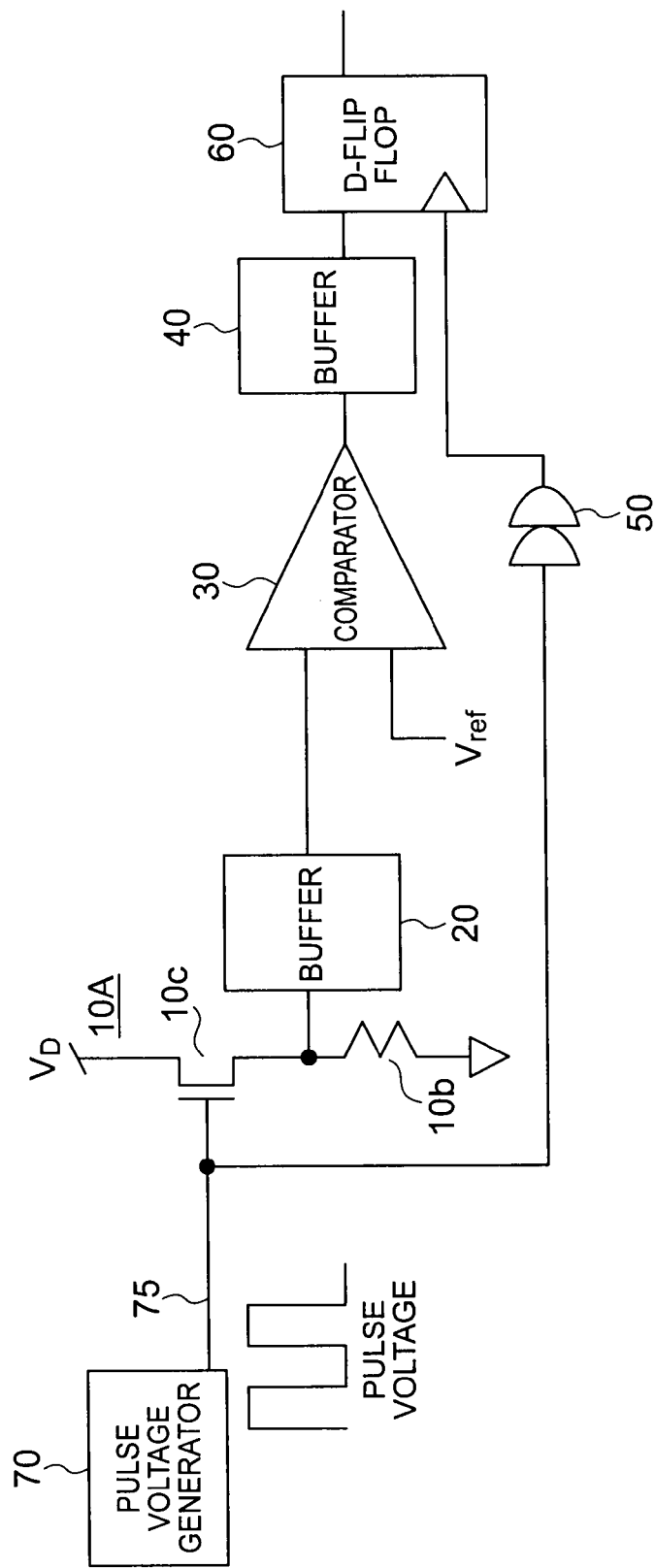
FIG. 20 is a block diagram illustrating a random number generating device according to a fourth embodiment.

FIG. 20 illustrates a random number generating device in accordance with a fourth embodiment of the present invention. The random number generating device of this embodiment is the same as the random number generating device of the first embodiment shown in FIG. 1, except that the random noise source 10 is replaced with a random noise source 10A. The random noise source 10A has a random noise generating element 10c, instead of the random noise generating element 10a.

Figure 21:
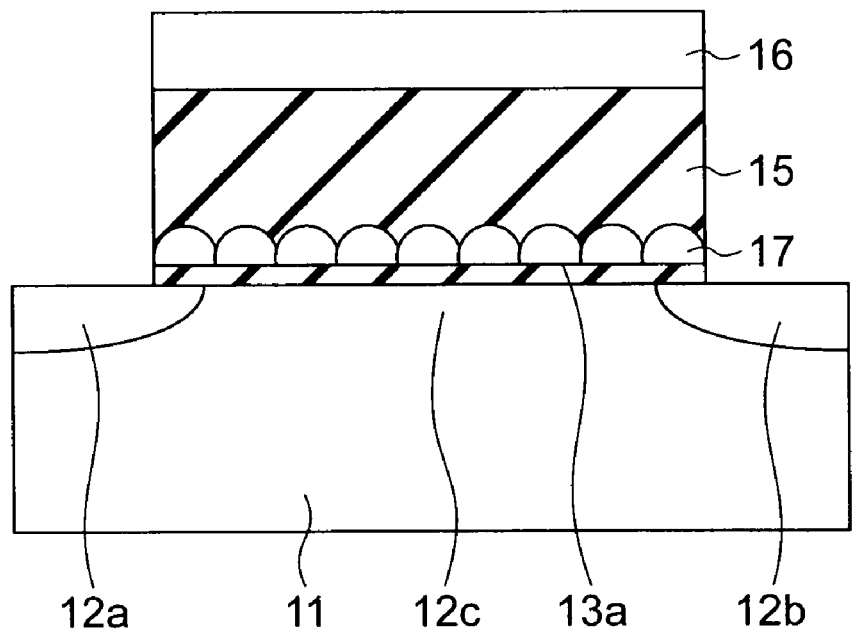
FIG. 21 is a cross-sectional view illustrating a random noise generating element to be used in the fourth embodiment.

As shown in FIG. 21, the random noise generating element 10c is a MOSFET. A source region 12a and a drain region 12b are formed on the surface region of a silicon substrate (a semiconductor substrate) 11. The region of the semiconductor substrate located between the source region 12a and the drain region 12b serves as the channel region 12c. It is preferable that the gate length L and the channel width (the gate width) W of the channel region 12c are small. The channel region 12c may be a region having a thin portion as part of the channel, with the thin portion having the length L and the width W. The source region 12a and the drain region 12b contain n-type impurities such as phosphorus (P) and arsenic (As). The channel region 12c, the source region 12a, and the drain region 12b are isolated from one another by device isolating insulating regions (not shown).

A tunnel insulating film 13a formed with a nitride film is provided on the channel region 12c, and conductive fine particles 17 containing Si, for example, are provided on the tunnel insulating film 13a. A control oxide film (a control insulating film) 15 is formed to cover the fine particles 17. A gate electrode (a control gate) 16 made of polysilicon, for example, is formed on the control insulating film 15.

The random noise generating element 10c is produced in the following manner. First, the surface of the semiconductor substrate 11 is nitrided through thermal nitridation using $NH_3$, so as to form the tunnel insulating film 13a that is a nitride film having a thickness T of 0.8 nm. By LPCVD (low pressure chemical vapor deposition), the fine particles 17 that are Si microcrystals having a mean particle size of 8 nm are formed on the tunnel insulating film 13a with a surface density of approximately $1.7 \times 10^{12}$ cm$^{-2}$. Here, the particle size of the fine particles 17 is controlled by adjusting the CVD time, and the surface density can be controlled by adjusting the temperature, the raw material gas flow rate and the number of CVD times. The control insulating film 15 made of $SiO_2$ is formed to cover the fine particles 17 by CVD, and the gate electrode 16 made of polysilicon is formed on the control insulating film 15.

Like the random noise generating element 10a used in the first to third embodiments, the random noise generating element 10c used in this embodiment can generate larger random noise in a case where a pulse voltage is applied to the gate electrode 16 than in a case where a fixed voltage is applied to the gate electrode 16.

The random noise generating element 10c used in this embodiment has the same structure as the random noise generating element disclosed in US 2005/0180219 A1. More specifically, as disclosed in US 2005/0180219 A1, the random noise generating element 10c used in this embodiment has a semiconductor channel that include a thin portion having a width W and a length L, with $W \leq (\pi/10(\mu m^2))/L$ being satisfied. A tunnel insulating film is provided on the semiconductor channel, and conducive fine particles that can charge or discharge electrons to and from the semiconductor channel via the tunnel insulating film are provided above the semiconductor channel via the tunnel insulating film, with a surface density of $2.5 \times 10^{11}$ cm$^{-2}$ or higher. In this random noise generating element, the conditions for obtaining 0.1% or more of fluctuation components at 1 MHz can be expressed as:

$$(D_{dot} \times d^{3/4}/W) \times \exp(-8\pi T(2\,mH)^{1/2}/(3h)) \times (0.5/L)^{1/2} \geq 4 [\mu m^{-5/3}]$$

where $D_{dot}$ represents the surface density of the conductive fine particles, d represents the mean particle size, W represents the width of the thin portion, T represents the thickness of the tunnel insulating film, H represents the energy barrier height between the semiconductor substrate and the tunnel insulating film, h represents the Planck's constant, q represents the elementary charge, m represents the effective mass tunneling the tunnel insulating film, and $\in$ represents the dielectric constant of the tunnel insulating film. As the conductive fine particles, it is preferable to use silicon crystalline fine particles, and more preferable to use metal fine particles of Au, Ag, or Al etc.

In this embodiment, larger random noise can be obtained by applying a pulse voltage to the gate electrode 16 of the random noise generating element 10c shown in FIG. 21, than by applying a fixed voltage to the gate electrode 16. In the following, this aspect of this embodiment is described.

By applying a pulse voltage to the gate electrode 16 of the random noise generating element 10c, random noise that is three times larger than the random noise obtained by applying a fixed voltage to the gate electrode can be obtained, as in the first to third embodiments. Accordingly, the requirement that the proportion of the 1-MHz fluctuation components is 0.1% or more is satisfied even with ⅓ of the value (=4) of the right-hand side of the above conditional equation. In other words, to obtain 0.10% or more fluctuation components at 1 MHz in this embodiment, the following conditional equation should be satisfied:

$$(D_{dot} \times d^{3/4}/W) \times \exp(-8\pi T(2\,mH)^{1/2}/(3h)) \times (0.5/L)^{1/2} \geq 4 \times (\tfrac{1}{3})[\mu m^{-5/3}] = 1.33[\mu m^{-5/3}]$$

In view of this, the conditions for the proportion of 1-MHz fluctuation components to be 0.01% or more and 1% or more are expressed as follows. To obtain 1% or more fluctuation components at 1 MHz, the following conditional equation should be satisfied:

$$(D_{dot} \times d^{3/4}/W) \times \exp(-8\pi T(2\,mH)^{1/2}/(3h)) \times (0.5/L)^{1/2} \geq 13.33[\mu m^{-5/3}]$$

To obtain 0.01% or more fluctuation components at 1 MHz, the following conditional equation should be satisfied:

$$(D_{dot} \times d^{3/4}/W) \times \exp(-8\pi T(2\,mH)^{1/2}/(3h)) \times (0.5/L)^{1/2} \geq 0.133[\mu m^{-5/3}]$$

The tunnel insulating film 13a of the random noise generating element 10c used in this embodiment is very thin, and it is considered that charges are moving between the channel and the trap at a high speed.

Accordingly, regardless of the cycle of the pulse to be applied to the gate electrode 16, charges can have a larger amount of noise components at any frequency when a pulse voltage is applied as in this embodiment, than in a case where the voltage to be applied to the gate electrode 16 is fixed.

As described above, the random number generating device of this embodiment can generate high-quality random numbers at a high speed. Also, as in US 2005/0180219 A1, it is not necessary to employ an amplifier circuit. Thus, a small-sized random number generating device can be obtained.

Fifth Embodiment

Figure 22:
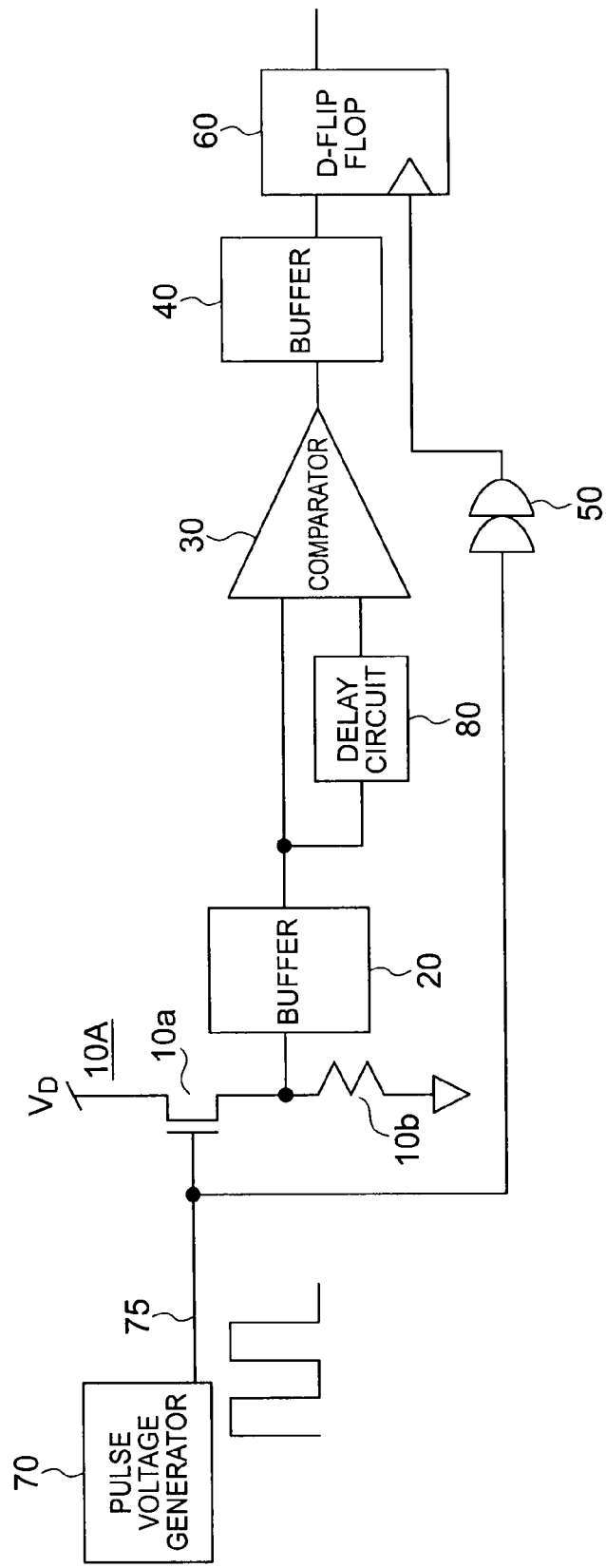
FIG. 22 is a block diagram illustrating a random number generating device according to a fifth embodiment.

FIG. 22 illustrates a random number generating device in accordance with a fifth embodiment of the present invention. The random number generating device of this embodiment is the same as the random number generating device of the second embodiment shown in FIG. 18, except that the random noise generating element 10a is replaced with the random noise generating element 10c shown in FIG. 21.

In this embodiment, high-quality random numbers can be generated at a high speed, as in the second embodiment and the fourth embodiment.

Sixth Embodiment

Figure 23:
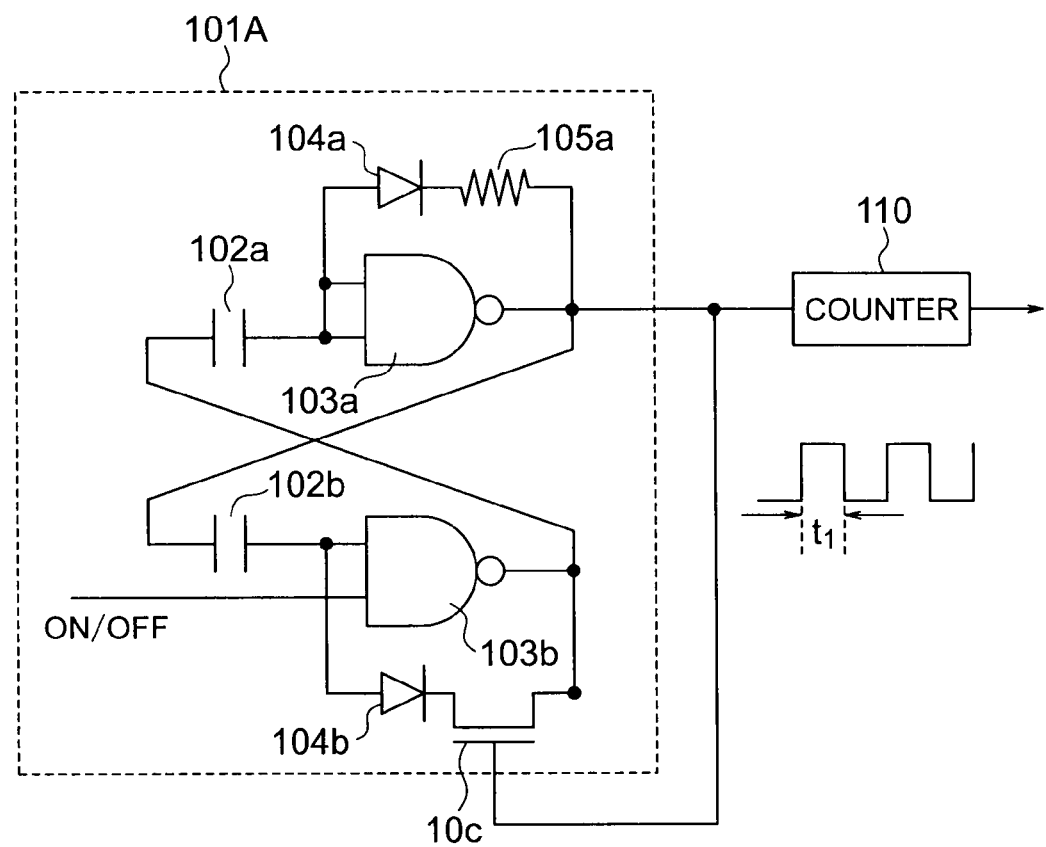
FIG. 23 is a block diagram illustrating a random number generating device according to a sixth embodiment.

FIG. 23 illustrates a random number generating device in accordance with a sixth embodiment of the present invention. The random number generating device of this embodiment is the same as the random number generating device of the third embodiment shown in FIG. 19, except that the random noise generating element 10a is replaced with the random noise generating element 10c shown in FIG. 21.

In this embodiment, high-quality random numbers can also be generated at a high speed, as in the third embodiment and the fourth embodiment.

In each of the random noise generating elements used in the first to sixth embodiments, the tunnel insulating film 13 is formed through thermal oxidation. However, it is also possible to use a natural oxide film that is formed in the atmosphere. Also, in each of the above described random noise generating elements, a silicon substrate is used as the semiconductor substrate. However, it is possible to use a semiconductor substrate made of a material other than silicon.

In the first to sixth embodiments, the input pulse frequency is equal to the random number generating rate. However, the ratio of the input pulse frequency to the random number generating rate (input pulse frequency/random number generating rate) may be an integer.

In the second embodiment, the delay in the delay circuit 90 may be adjusted so that the (input pulse frequency/generating rate) becomes a rational number.

Synchronous random noise reinforcement by a pulse input leads to random noise reinforcement in the periodic components of the pulse. Accordingly, in a case where random noise is converted into clock digital signals through oscillation outputs as in the third embodiment, random noise reinforcement by a pulse can be used, even if the (input pulse/generating rate) is a surd.

A random noise generating device in accordance with the present invention is not limited to any of the random number generating devices of the first to sixth embodiments, as long as it includes a circuit that can achieve a noise increasing effect by applying a pulse voltage to the gate electrode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A random number generating device comprising:
a pulse voltage generator configured to generate a pulse voltage having an amplitude of 26 mV or more;
a random noise generating element including source and drain regions formed at a distance from each other on a semiconductor substrate, a tunnel insulating film formed on a portion of the semiconductor substrate located between the source region and the drain region, a gate electrode formed above the tunnel insulating film and to which the pulse voltage is applied, and a trap insulating film provided between the tunnel insulating film and the gate electrode, the random noise generating element configured to generate a random noise contained in a current flowing between the source region and the drain region; and
a random number generating unit configured to generate a random number signal based on the random noise,
wherein:
the trap insulating film has dangling bonds, and is expressed as: $Si_x(SiO_2)_y(Si_3N_4)_{1-y}M_z$ (M representing an element other than Si, O, and N, $x \geq 0$, $1 \geq y \geq 0$, $z \geq 0$, except a case where x, y, and z are 0); and
the random noise generating element satisfies an equation:

$$[x/(x+7-4y+z) \times \{(4-4y)/(4-2y)+2y/(4-2y) \times 2\} + 0.01174]^{1/2} \times \exp(-T\{H/3.1\}^{1/2}/0.8664)/LW^{2/5} \geq 0.12 [\mu m^{-7/5}]$$

where L represents a channel length [μm] of the channel region, W represents a channel width [μm] of the channel region, T represents a thickness [nm] of the tunnel insulating film ($T \geq 0$), and H represents a barrier height [eV] between the semiconductor substrate and the tunnel insulating film.

2. The device according to claim 1, wherein the random number signal that is output from the random number generating unit has a frequency that is a rational multiple of a frequency of the pulse voltage.

3. The device according to claim 1, wherein the random number signal that is output from the random number generating unit has a frequency that is an integral multiple of a frequency of the pulse voltage.

4. The device according to claim 1, wherein the random number signal that is output from the random number generating unit is equal to a frequency of the pulse voltage.

5. The device according to claim 1, wherein:
the random noise generating element has one end connected to a power source, and has the other end grounded via a resistor; and
the random number generating unit configured to compare a potential of a connection node of the random noise generating element and the resistor, with a reference potential, and, based on a result of the comparison, generates a random number.

6. The device according to claim 1, further comprising a delay circuit,
wherein:
the random noise generating element has one end connected to a power source, and has the other end grounded via a resistor; and
the random number generating unit configured to compare a potential of a connection node of the random noise generating element and the resistor, with a potential obtained by the delay circuit delaying the potential of the connection node, and, based on a result of the comparison, generates a random number.

7. The device according to claim 1, wherein:
the pulse voltage generator is a multivibrator that includes at least two feedback resistors, with one of the two feedback resistors being replaced with the random noise generating element.

8. A random number generating device comprising:
a pulse voltage generator configured to generate a pulse voltage having an amplitude of 26 mV or more;
a random noise generating element including source and drain regions formed at a distance from each other on a semiconductor substrate, a tunnel insulating film formed on a portion of the semiconductor substrate located between the source region and the drain region, a gate electrode formed above the tunnel insulating film and to which the pulse voltage is applied, and a trap insulating film provided between the tunnel insulating film and the gate electrode, the random noise generating element configured to generate a random noise contained in a current flowing between the source region and the drain region; and
a random number generating unit configured to generate a random number signal based on the random noise,
wherein:
the trap insulating film has dangling bonds, is nonstoichiometric, and is expressed as: $Si_x(SiO_2)_y(Si_3N_4)_{1-y}M_z$ (M representing an element other than Si, O, and N, $x \geq 0$, $1 \geq y \geq 0$, $z \geq 0$, except a case where x, y, and z are 0); and
the random noise generating element satisfies an equation:

$$[x/(x+7-4y+z) \times \{(4-4y)/(4-2y)+2y/(4-2y) \times 2\}]^{1/2} \times \exp(-T\{H/3.1\}^{1/2}/0.8664)/LW^{2/5} \geq 0.12 [\mu m^{-7/5}]$$

where L represents a channel length [μm] of the channel region, W represents a channel width [μm] of the channel region, T represents a thickness [nm] of the tunnel insulating film (T≧0), and H represents a barrier height [eV] of the tunnel insulating film.

9. The device according to claim 8, wherein the random number signal that is output from the random number generating unit has a frequency that is a rational multiple of a frequency of the pulse voltage.

10. The device according to claim 8, wherein the random number signal that is output from the random number generating unit has a frequency that is an integral multiple of a frequency of the pulse voltage.

11. The device according to claim 8, wherein the random number signal that is output from the random number generating unit is equal to a frequency of the pulse voltage.

12. The device according to claim 8, wherein:
the random noise generating element has one end connected to a power source, and has the other end grounded via a resistor; and
the random number generating unit configured to compare a potential of a connection node of the random noise generating element and the resistor, with a reference potential, and, based on a result of the comparison, generates a random number.

13. The device according to claim 8, further comprising a delay circuit,
wherein:
the random noise generating element has one end connected to a power source, and has the other end grounded via a resistor; and
the random number generating unit configured to compare a potential of a connection node of the random noise generating element and the resistor, with a potential obtained by the delay circuit delaying the potential of the connection node, and, based on a result of the comparison, generates a random number.

14. A random number generating device comprising:
a pulse voltage generator configured to generate a pulse voltage having an amplitude of 26 mV or more;
a random noise generating element including source and drain regions formed at a distance from each other on a semiconductor substrate, a tunnel insulating film formed on a portion of the semiconductor substrate located between the source region and the drain region, and a gate electrode formed above the tunnel insulating film and to which the pulse voltage is applied, the random noise generating element configured to generate a random noise contained in a current flowing between the source region and the drain region; and
a random number generating unit configured to generate a random number signal based on the random noise,
wherein:
the random noise generating element includes a set of conductive fine particles on the tunnel insulating film, and a control insulating film that is provided between the set of conductive fine particles and the gate electrode and covers the set of conductive fine particles;
the channel region has a channel width W and a channel length L, with $W \leq (\pi/10(\mu m^2))/L$ being satisfied: and
the random noise generating element satisfies an equation:

$$(D_{dot} \times d^{3/4}/W) \times \exp(-8\pi T(2mH)^{1/2}/(3h)) \times (0.5/L)^{1/2} \geq 0.133 \, [\mu m^{-5/3}]$$

where T represents a thickness [nm] of the tunnel insulating film, H represents an energy barrier height [eV] between the semiconductor substrate and the tunnel insulating film, m represents an effective mass of an electron tunneling the tunnel insulating film, ∈ represents a dielectric constant of the tunnel insulating film, $D_{dot}$ represents a surface density [cm$^{-2}$] of the set of conductive fine particles, d represents a mean particle size [nm] of the set of conductive fine particles, and h represents a Planck's constant.

15. The device according to claim 14, wherein the random number signal that is output from the random number generating unit has a frequency that is a rational multiple of a frequency of the pulse voltage.

16. The device according to claim 14, wherein the random number signal that is output from the random number generating unit has a frequency that is an integral multiple of a frequency of the pulse voltage.

17. The device according to claim 14, wherein the random number signal that is output from the random number generating unit is equal to a frequency of the pulse voltage.

18. The device according to claim 14, wherein:
the random noise generating element has one end connected to a power source, and has the other end grounded via a resistor; and
the random number generating unit configured to compare a potential of a connection node of the random noise generating element and the resistor, with a reference potential, and, based on a result of the comparison, generates a random number.

19. The device according to claim 14, further comprising a delay circuit,
wherein:
the random noise generating element has one end connected to a power source, and has the other end grounded via a resistor; and
the random number generating unit configured to compare a potential of a connection node of the random noise generating element and the resistor, with a potential obtained by the delay circuit delaying the potential of the connection node, and, based on a result of the comparison, generates a random number.

* * * * *